(12) United States Patent
Ikari et al.

(10) Patent No.: US 6,548,886 B1
(45) Date of Patent: Apr. 15, 2003

(54) SILICON SEMICONDUCTOR WAFER AND METHOD FOR PRODUCING THE SAME

(75) Inventors: Atsushi Ikari, Chiba (JP); Masami Hasebe, Chiba (JP); Katsuhiko Nakai, Chiba (JP); Hikaru Sakamoto, Chiba (JP); Wataru Ohashi, Chiba (JP); Taizo Hoshino, Yamaguchi (JP); Toshio Iwasaki, Yamaguchi (JP)

(73) Assignee: Wacker NSCE Corporation, Tokyo (JP)

( * ) Notice: Subject to any disclaimer, the term of this patent is extended or adjusted under 35 U.S.C. 154(b) by 0 days.

(21) Appl. No.: 09/508,467

(22) PCT Filed: Apr. 30, 1999

(86) PCT No.: PCT/JP99/02336

§ 371 (c)(1),
(2), (4) Date: Mar. 10, 2000

(87) PCT Pub. No.: WO99/57344

PCT Pub. Date: Nov. 11, 1999

(30) Foreign Application Priority Data

| May 1, 1998 | (JP) | 10-122284 |
| Aug. 7, 1998 | (JP) | 10-224829 |
| Mar. 26, 1999 | (JP) | 11-084915 |
| Mar. 26, 1999 | (JP) | 11-084916 |

(51) Int. Cl.$^7$ .............................. H01L 29/167
(52) U.S. Cl. ........................ 257/610; 117/13; 117/19
(58) Field of Search ............... 257/610, 611, 257/617; 117/13, 15, 17, 19

(56) References Cited

U.S. PATENT DOCUMENTS

| 5,683,504 A | * 11/1997 | Izunome et al. | 117/13 |
| 5,700,320 A | * 12/1997 | Izunome et al. | 117/19 |
| 5,704,974 A | * 1/1998 | Izunome et al. | 117/19 |
| 5,935,320 A | 8/1999 | Graef et al. | 117/2 |
| 6,080,237 A | * 6/2000 | Iwasaki et al. | 117/13 |

FOREIGN PATENT DOCUMENTS

| JP | 57-17497 | 1/1982 |
| JP | 59-202640 | 11/1984 |
| JP | 60-251190 | 12/1985 |
| JP | 2-267195 | 10/1990 |
| JP | 5-283350 | 10/1993 |
| JP | 5-294780 | 11/1993 |
| JP | 6-279188 | 10/1994 |
| JP | 7-206591 | 8/1995 |

(List continued on next page.)

OTHER PUBLICATIONS

Graf et al., "Characterization of Crystal Quality By Delineation Of Cop And The Impact On The Silicon Wafer Surface", Electrochemical Society Proceedings vol. 96–13, pp. 117–131 (1996).

Kakumoto et al., "Deep Level Induced by Diffused $N_2$ and Vacancy Complex in Si" Proceedings of The $2^{nd}$ International Symposium on Advanced Science and Technology of Silicon Materials, pp. 437–442 (1996).

*Primary Examiner*—Kevin M. Picardat
(74) *Attorney, Agent, or Firm*—Wenderoth, Lind & Ponack, L.L.P.

(57) ABSTRACT

A silicon semiconductor substrate is obtained by deriving a silicon semiconductor substrate from a silicon single crystal grown by the Czochralski method from a molten silicon containing not less than $1 \times 10^{16}$ atoms/cm$^3$ and not more than $1.5 \times 10^{19}$ atoms/cm$^3$ of nitrogen and heat-treating the silicon semiconductor substrate at a temperature of not less than 1000° C. and not more than 1300° C. for not less than one hour and is characterized by the fact that the density of crystal defects measuring not less than 0.1 μm as reduced to diameter is not more than $10^4$ pieces/cm$^3$ at least in the region reaching a depth of 1 μm from the surface of the substrate and the nitrogen content at the center of thickness of the silicon semiconductor substrate is not less than $1 \times 10^{13}$ atoms/cm$^3$ and not more than $1 \times 10^{16}$ atoms/cm$^3$.

26 Claims, 6 Drawing Sheets

FOREIGN PATENT DOCUMENTS

| JP | 8-12493 | 1/1996 |
| JP | 8-91983 | 4/1996 |
| JP | 8-91993 | 4/1996 |
| JP | 8-162406 | 6/1996 |
| JP | 8-250506 | 9/1996 |
| JP | 9-199507 | 7/1997 |
| JP | 9-227289 | 9/1997 |
| JP | 10-98047 | 4/1998 |

\* cited by examiner

Intentional Cu,Ni,Fe contamination : $1.0 \times 10^{12}/cm^2$

SILICON SEMICONDUCTOR WAFER AND METHOD FOR PRODUCING THE SAME

TECHNICAL FIELD

This invention relates to improvements in and concerning the quality of a silicon semiconductor substrate, more particularly to a silicon semiconductor substrate which allows exclusion of a defect from the interior or surface of the substrate and permits formation of devices on the substrate in an exalted yield, and a method for the production thereof.

This invention relates further to improvements in and concerning the quality of an epitaxial silicon semiconductor substrate, more particularly to an epitaxial semiconductor substrate which, owing to the exclusion of a defect from the epitaxial layer and from the neighborhood of the interface between the epitaxial layer and a substrate wafer and the improvement in gettering ability, permits formation of devices on the epitaxial substrate in an exalted yield, and a method for the production thereof.

RELATED ART

It is known that in consequence of the improvement attained in recent years in the degree of integration of devices, minute defects existing on the surface and near the surface layer of a silicon semiconductor substrate since immediately after manufacture of the substrate and crystal defects induced during the course of production of devices result in lowering the yield of production of devices as by inducing impairment of device patterns during the formation of devices and imperfecting the devices in performance. As the cause for this lowered yield of devices, the defects called "crystal originated particles" or "crystal originated pits" (COP) that are detected in the form of pits, about 0.1 μm in size, on the surface of a substrate immediately after manufacture of the substrate have been attracting attention.

The reason for calling the defects by this name is that when a silicon semiconductor substrate is etched with an ammonia-hydrogen peroxide liquid mixture, pits which originate in lattice defects in a crystal manifest themselves on the surface of the substrate and these pits are detected during the determination with a testing device adapted to take count of particles on the substrate surface. The COP is a term for designating all the defects that are detected by such method of determination. In the single silicon crystal which is grown by the ordinary Czochralski (CZ) method or the CZ method using an applied magnetic field, these defects are considered to be actually octahedral voids (hereinafter referred to as "void defects") in the crystal. It is inferred that these void defects induce the devices to suffer from impairment of patterns or compel the devices to incur structural breakage. To date, several techniques have been proposed with a view to decreasing or disappearing the COP which is harmful to the manufacture of devices.

As a technique for disappearing the COP, the method which consists in limiting the speed of growth of a single crystal to not more than 0.8 mm/min (JP-A-02-267,195) has been known. This method is intended to repress the occurrence of supersaturated vacancy-type point defects (vacancies) in a single crystal being grown during the course of cooling by decreasing the amount of vacancies, i.e. an element which gives rise to void defects, to be introduced into the interface of growth of the crystal and slackening the speed of cooling the crystal as well. This method, however, entails such problems as deriving a decrease in productivity from a fall in the speed of growth and, at the same time, generating such crystal defects as dislocation loops which are different in kind from the COP.

As techniques for repressing the generation of COP, the method of controlling the behavior of a single crystal in the course of cooling and particularly the method of controlling the time required by the single crystal in passing an approximate range of temperature from 1200° C. to 1000° C. have been known to be effective (JP-A-08-12,493, JP-A-08-91,983, and JP-A-09-227,289). These techniques pose no problem in terms of productivity because they bring no noticeable decrease in the speed of growth of the single crystal. Since they have the lower limits of decrease of the density of COP generally in the neighborhood of $10^5$ pieces/cm$^3$, they encounter difficulty in attaining a further decrease in the density to not more than $10^4$ pieces/cm$^3$, for example.

As a technique for decreasing the COP, the method which comprises limiting the time for retaining a single crystal, while the crystal is in the process of being cooled during the growth thereof, in a temperature range of 850° C.–1100° C. to less than 80 minutes or attaining in the growth of a crystal a silicon single crystal having a nitrogen concentration of $1\times10^{14}$/cm$^3$ and thereafter manufacturing the silicon single crystal into a silicon wafer and heat-treating the wafer at a temperature of not less than 1000° C. for not less than one hour (JP-A-10-98,047). This technique is intended to abolish defects during the heat treatment by shifting the size distribution of the COP generated during the production of the crystal toward the smaller side. Since it is generally held that the effect of this decrease in size gains in prominence in accordance as the oxygen concentration decreases, however, this technique is not put to use at the oxygen concentration of $7\times10^{17}$–$10\times10^{17}$/cm$^3$ which is commonly used in the Czochralski method. Thus, it is difficult to establish compatibility between the impartation of the gettering ability which utilizes the formation of an oxygen precipitate in the substrate generally attained by increasing the oxygen concentration in the substrate and the decrease of the COP.

In addition to the technique for decreasing the COP during the growth of a single crystal, the technique which effects decrease or disappearance of the COP on the surface of a substrate by slicing and polishing a single crystal and manufacturing it into a substrate and thereafter subjecting the substrate to a heat treatment has been known. JP-A-03-233,936, for example, proposes the performance of a heat treatment at 800–1250° C. for not more than 10 hours. When the heat treatment is carried out in an oxidizing atmosphere indicated in a working example which is cited in this patent publication, however, it is at a disadvantage in inducing an increase in the number of pits formed on the surface of the substrate because the etching by oxidation of the surface of the substrate entails etch pits of void defects to the surface of the substrate and, at the same time, rendering it difficult to lower the density of COP within a depth of 1 μm from the surface of the substrate below $10^4$ pieces/cm$^3$. Then, JP-A-59-202,640 proposes the performance of a heat treatment in an atmosphere of hydrogen. Though this method, owing to the use of the atmosphere of hydrogen, is capable of abolishing the COP on the outermost surface and lowering the COP density within a depth of 0.5 μm from the surface below $10^4$ pieces/cm$^3$, it is incapable of lowering the density of the COP in a deeper portion from the surface below $10^4$ pieces/cm$^3$ and unsatisfactory for the formation of a defect-less layer from the viewpoint of the manufacture of devices. Moreover, this method uses an explosive atmosphere of hydrogen and, therefore, requires a perfect measure for safety.

Concerning the doping of nitrogen preparatory to the growth of a single crystal of silicon, methods for the doping have been known as from JP-A-60-251,190, etc. In search of the effect of doping of nitrogen on the floating zone (FZ) single crystal, JP-A-57-17,497 discloses a method for enhancing the strength of crystal and JP-A-08-91,993 a method for repressing variation in the resistance. Then, JP-A-05-294,780 has a disclosure to the effect that the nitrogen doped into silicon acts on or binds with vacancies, i.e. one form of complexes, and consequently represses the formation of vacancy participated clusters (void defects) and curbs the occurrence of etch pits which are thought to originate in void defects. It has been reported by D. Graf et al. (The Electrochemical Society Proceeding, Vol. 96–13, pp. 117, 1996) that where oxygen is present in a single crystal, the doping of nitrogen results in decreasing the COP defects. They explain this mechanism by inferring that a mechanism similar to one which represses vacancies in the FZ crystal functions in the case of a CZ crystal and decreases the size of void defects which are aggregates of vacancies. As reported in K. Kakumoto, et al.; Proceedings of The $2^{nd}$ International Symposium on Advanced Science and Technology of Silicon Materials, p. 437–442 (1996), it has been known that when the defects resulting from the linkage of nitrogen and vacancies increase, they constitute themselves the centers of generation or recombination of electrons and electron holes in silicon crystal and alter electric properties and also that in a silicon substrate containing oxygen, nitrogen forms compound defects with oxygen and consequently alters the resistance of the substrate and further facilitates the occurrence of stacking faults in consequence of a heat treatment.

Further, as a silicon semiconductor substrate which inhibits occurrence of various crystal defects such as oxygen precipitate, dislocation loop, and stacking faults other than the COP in the neighborhood of the surface of the substrate, the epitaxial silicon substrate which is produced by epitaxially growing a silicon single crystal layer as by the method of chemical vapor growth on a wafer manufactured by slicing and specular polishing a silicon single crystal grown by the CZ method or the CZ method using application of a magnetic field has come to attract attention and find adoption in actual use.

Though the epitaxial silicon substrate is a substrate which has newly deposited on a silicon wafer a single crystal layer such that contains substantially no oxygen or defect as described above, it has entailed such problems as generating defects in the epitaxial layer, depending on the surface condition of the wafer during the deposition of the epitaxial layer (the presence of void defects such as the COP, defects such as pits originating in oxygen precipitation and minute hills called hill rocks, and stacking faults), inducing defects in the epitaxial layer, or generating defects in the epitaxial layer during device fabrication process because of void defects or oxygen impurities existed in the neighborhood of the wafer surface, or inducing defects owing to diffusion of vacancies or oxygen impurities into the epitaxial layer. For the purpose of obtaining an epitaxial silicon substrate of high quality, therefore, the technique for attaining thorough preclusion of defects on the surface and in the neighborhood of the original wafer itself which is fated to support the epitaxial layer thereon plays an important role. Since the wafer itself is required to have a gettering ability for the sake of offering resistance to various forms of pollution liable to occur during the course of manufacture of devices, it is likewise important to have defects having the gettering ability built in suitably in the central part of the wafer. Further, the cost of production of the substrate tends to increase because the process of production from the growth of a single crystal till the impartation of an epitaxial layer is long and because the quality control is carried out strictly. It is also an important task to find an answer to the question how an epitaxial silicon semiconductor substrate of high quality is to be produced at a low cost.

Concerning silicon wafers which are used for epitaxial substrates, several inventions published to date offer techniques for decreasing defects in the neighborhood of surface and techniques for building defects in the wafer interior for the sake of improving the gettering ability. JP-A-05-283, 350, for example, proposes a method for the production of an epitaxial silicon semiconductor wafer, which comprises subjecting a wafer which has undergone an intrinsic gettering (IG) treatment to a heat treatment in an atmosphere containing hydrogen prior to the vapor growth of a silicon single crystal thin film thereby abolishing from the wafer-substrate the points of origin for the occurrence of defects in the silicon single crystal thin film and thereafter forming a thin film by vapor growth. Then, JP-A-08-250,506 proposes a silicon epitaxial wafer having a BMD density adjusting region formed in the interior thereby, obtained by using a wafer manufactured from a silicon ingot and subjecting this wafer to a step of performing an IG treatment for the impartation of IG effect, a step of retaining a temperature for controlling the density of oxygen precipitate (BMD), and a step of performing an epitaxial treatment on the wafer surface. Further, JP-A-09-199,507 proposes a semiconductor substrate which, by a specific heat treatment serving to effect inclusion of a stated amount of a $SiO_2$ precipitate in a deeper layer than the LSI forming zone where the surface layer has a denuded zone (DZ) and to effect inclusion of a stated amount of $SiO_2$ precipitate substantially uniformly from the surface downward where the subsequent step forms an epitaxial film, is made to exhibit a high IG ability to polluting heavy metals, decrease the warp of a substrate, and excel in strength. Since these techniques, while necessitating varying forms of heat treatment, attach the foremost priority to securing the IG effect of the wafer's own, they entail such problems as failing to attain perfect elimination of the crystal defects existing on the surface and near the surface layer of a substrate wafer fated to base deposition of an epitaxial layer and doing harm to epitaxial growth, suffering persistence of defects in the epitaxial layer, and inducing the occurrence of defects in the process of manufacture of devices. The heat treatment itself is at a disadvantage as well in being so complicated as to degrade productivity greatly and boost the cost of production. Then, JP-A-08-162,406 proposes a wafer which is obtained by preparatorily subjecting a substrate silicon wafer containing crystal defects at a high density of not less than $5 \times 10^6$ pieces/$cm^3$ to epitaxial growth thereby providing a gettering layer in the interior of the substrate. This method likewise entails such problems as failing to attain perfect elimination of the crystal defects existing on the surface and near the surface layer of a substrate wafer fated to base deposition of an epitaxial layer and doing harm to epitaxial growth, suffering persistence of defects in the epitaxial layer, and inducing the occurrence of defects in the process of manufacture of devices.

The conventional techniques combine merits and demerits of their own as described above. With a view to answering the demand imposed in recent years on the semiconductor devices to attain further miniaturization and integration, therefore, the desirability of developing a method for effecting elimination of the crystal defects near the surface of a silicon substrate so as to permit provision at a low cost of a semiconductor substrate of such high quality as has a fully satisfactory IG ability in the substrate has been finding growing recognition.

DISCLOSURE OF THE INVENTION

In the first aspect, this invention has an object of providing a silicon semiconductor substrate having decreased or disappeared with high productivity the crystal defects which occur on a silicon semiconductor substrate for use in the manufacture of semiconductor devices, can not be abolished completely by the conventional techniques mentioned above, and pose a problem to the manufacture of devices thereon, and a method for the production thereof.

This invention, in the formation of a DZ by the heat treatment of a silicon single crystal substrate for use in the manufacture of semiconductor devices, has a further object of providing, by virtue of a heat treatment using a safe atmosphere, a semiconductor substrate incorporating therein a DZ of high quality not having such crystal defects as COP copiously.

This invention in the second aspect has an object of providing an epitaxial silicon semiconductor substrate of high quality and low cost which has generously repressed the occurrence of defects in the epitaxial layer and in the region approximating the interface between the epitaxial layer and a substrate wafer and has imparted an IG characteristic to the epitaxial layer and a method for the production thereof.

The present inventors, after pursuing a diligent study concerning the defects which occur in a silicon semiconductor substrate, have discovered that the defects of a size such as to pose a problem in the region of manufacture of devices on a silicon semiconductor substrate can be abolished nearly completely. This invention has been perfected based on this discovery.

Specifically, in the first aspect, this invention concerns a silicon semiconductor substrate which is obtained from a silicon single crystal as grown by the Czochralski (CZ) method and is characterized by the fact that in a region reaching a depth of at least 1 μm from the surface of the substrate, the density of crystal defects measuring not less than 0.1 μm as reduced to diameter is not more than $10^4$ pieces/cm$^3$. More preferably, the silicon semiconductor substrate has at the center of thickness a nitrogen content of not less than $1 \times 10^{13}$ atoms/cm$^3$ and not more than $1 \times 10^{16}$ atoms/cm$^3$. Further, the silicon semiconductor substrate according to this invention is such that the nitrogen content thereof is not more than $1 \times 10^{16}$ atoms/cm$^3$, particularly not less than $1 \times 10^{13}$ atoms/cm$^3$ and not more than $1 \times 10^{16}$ atoms/cm$^3$, and the nitrogen concentration thereof determined throughout the entire volume of the substrate by the method of secondary ion mass analysis has a part locally concentrated by a nitrogen segregation exhibiting a signal intensity of not less than twice the average signal intensity.

This invention further concerns a silicon semiconductor substrate which is obtained from a silicon single crystal grown by the CZ method and is characterized by containing crystal defects at a density distribution decreasing from the center of thickness of the substrate to the surface, containing crystal defects measuring not less than 0.1 μm as reduced to diameter on the surface of the substrate at a surface density of not more than one piece/cm$^3$, containing crystal defects measuring not less than 0.1 μm as reduced to diameter at a depth of 0.1 μm from the surface of the substrate at a volumetric density of not more than 1% of that at the center of thickness of the substrate, and having at the center of thickness of the substrate a nitrogen content of not less than $1 \times 10^{13}$ atoms/cm$^3$ and not more than $1 \times 10^{16}$ atoms/cm$^3$. The term "crystal defects" as used herein embraces all the crystal defects such as void defects, oxygen precipitate, and stacking faults which are causes for defective devices.

This invention further concerns a method for the production of a silicon semiconductor substrate characterized by heat-treating at a temperature of not less than 1000° C. and not more than 1300° C. for not less than one hour a silicon semiconductor substrate obtained from a silicon single crystal grown by the CZ method using fused silicon containing nitrogen at a concentration of not less than $1 \times 10^{16}$ atoms/cm$^3$ and not more than $1.5 \times 10^{19}$ atoms/cm$^3$. Further, the growth of the silicon single crystal by the CZ method is preferred to proceed under conditions satisfying the formula, $V/G \geq 0.2$ (mm$^2$/°C.min), wherein V denotes the speed of pulling (mm/min) and G the average of the temperature gradient in the crystal in the direction of the axis of pulling in a temperature range from the melting point of silicon to 1300° C. (°C./mm). Preferably, the heat treatment is carried out in a non-oxidizing gaseous atmosphere or it is carried out in a gaseous atmosphere containing not less than 0.01 vol. % and not more than 100 vol. % of oxygen, with the surface of the substrate subsequently polished to a depth of not less than 0.5 μm and not less than 1.0 μm till specular finish.

Concerning the defects which occur on an epitaxial silicon semiconductor substrate, the present inventors have pursued a diligent study on such experiments and theoretical discussions as covering the step of manufacturing devices, the step of epitaxial growth, and further the step of production of a silicon wafer and have consequently acquired a novel knowledge. This invention has been perfected as a result.

Specifically, in the second aspect, this invention concerns a silicon semiconductor substrate characterized by using a silicon wafer having a nitrogen content of not less than $1.0 \times 10^3$ atoms/cm$^3$ and not more than $1.0 \times 10^{16}$ atoms/cm$^3$ as a substrate wafer and depositing on the surface of the substrate wafer a silicon single crystal layer by the epitaxial method.

This invention further concerns a silicon semiconductor substrate which is obtained by using a silicon wafer having an oxygen content of not less than $1.0 \times 10^{17}$ atoms/cm$^3$ as a substrate wafer and depositing on the surface of the substrate wafer a silicon single crystal layer by the epitaxial method and is characterized by containing crystal defects measuring not less than 0.1 μm as reduced to diameter at least in a region reaching a depth of 1 μm from the interface between the substrate wafer mentioned above and the silicon single crystal layer deposited by the epitaxial method at a density of not more than $5 \times 10^4$ pieces/cm$^3$. Preferably, the substrate wafer mentioned above contains not less than $1.0 \times 10^{13}$ atoms/cm$^3$ and not more than $1.0 \times 10^{16}$ atoms/cm$^3$ of nitrogen.

This invention further concerns a silicon semiconductor substrate which is obtained by using a silicon wafer having an oxygen content of not less than $1.0 \times 10^{17}$ atoms/cm$^3$ as a substrate wafer and depositing on the surface of the substrate wafer a silicon single crystal layer by the epitaxial method and is characterized by containing crystal defects measuring not less than 20 nm as reduced to diameter at least in a region reaching a depth of 1 μm from the interface between the substrate wafer mentioned above and the silicon single crystal layer deposited by the epitaxial method at a density of not more than $5 \times 10^5$ pieces/cm$^3$. Further, in the region reaching a depth of 1 μm from the interface between the substrate wafer mentioned above and the silicon single crystal layer deposited by the epitaxial method, the density of the crystal defects measuring not less than 0.1 μm as reduced to diameter is preferred to be not more than $5 \times 10^4$ pieces/cm$^3$. Further, the substrate wafer mentioned above is preferred to contain not less than $1.0 \times 10^{13}$ atoms/cm$^3$ and not more than $1.0 \times 10^{16}$ atoms/cm$^3$.

Further, in any of the silicon semiconductor substrates according to the second aspect of this invention, the crystal defects measuring not less than 20 nm as reduced to diameter are preferred to be contained at the center of thickness of the substrate wafer at a density of not less than $1 \times 10^8$ pieces/cm$^3$.

This invention further concerns a method for the production of a silicon semiconductor substrate characterized by using a silicon wafer obtained from a silicon single crystal grown by using molten silicon containing not less than $1.0 \times 10^{16}$ atoms/cm$^3$ and not less than $1.5 \times 10^{19}$ atoms/cm$^3$ of nitrogen as a substrate wafer and depositing on the surface of the substrate water a silicon single crystal layer by the epitaxial method.

Further, this method concerns a method for the production of a silicon semiconductor substrate characterized by using a silicon wafer obtained from a silicon single crystal grown by the Czochralski method at a cooling speed of not more than 2.0° C./minute through the range of temperature from the solidifying point to the crystallization point of 800° C. as a substrate wafer and depositing on the surface of the substrate wafer a silicon single crystal layer by the epitaxial method. Further, the silicon single crystal is preferred to be grown by using molten silicon containing not less than $1.0 \times 10^{16}$ atoms/cm$^3$ and not more than $1.5 \times 10^{19}$ atoms/cm$^3$ of nitrogen.

This invention further concerns a method for the production of a silicon semiconductor substrate characterized by using a silicon wafer obtained from a silicon single crystal grown by the Czochralski method at a cooling speed of not less than 1.0° C./minute through the range of temperature from 800° C. to the crystallization point of 400° C. as a substrate wafer and depositing a silicon single crystal layer on the surface of the substrate wafer by the epitaxial method. Further, the silicon single crystal is preferred to be grown by using molten silicon containing not less than $1.0 \times 10^{16}$ atoms/cm$^3$ and not more than $1.5 \times 10^{19}$ atoms/cm$^3$ of nitrogen.

Then, this invention concerns a method for the production of a silicon semiconductor substrate which is characterized by using as a substrate wafer a silicon wafer obtained from a silicon single crystal grown by the Czochralski method, i.e. the silicon single crystal grown during the course of pulling the crystal at a cooling speed of not less than 2.0° C./minute through the range of temperature from the solidifying point to the crystallization point of 800° C. and subsequently grown at a cooling speed of not less than 1.0° C. through the range of temperature of 800° C.–400° C., and depositing on the surface of the substrate wafer a silicon single crystal layer by the epitaxial method. Further, the silicon single crystal is preferred to be grown by using molten silicon containing not less than $1.0 \times 10^{16}$ atoms/cm$^3$ and not more than $1.5 \times 10^{19}$ atoms/cm$^3$ of nitrogen.

Preferably, any of the methods of production according to the second aspect of this invention comprises using as a substrate wafer a silicon wafer obtained from a silicon single crystal grown by the Czochralski method and heat-treated at a temperature of not less than 1000° C. and not more than 1300° C. for not less than five minutes and depositing a silicon single crystal layer on the surface of this substrate wafer by the epitaxial method.

BEST MODE FOR EMBODYING THE INVENTION

Figure 1:
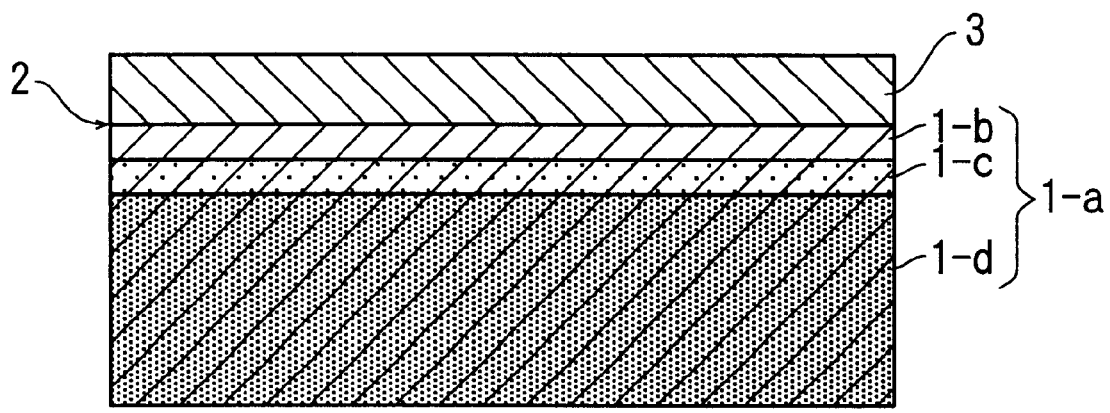
FIG. 1 is one example of the conceptual sectional view of the silicon semiconductor substrate of the present invention.

Now, this invention will be described specifically below based on the modes of embodiment.

The silicon semiconductor substrate of this invention according to the first aspect thereof is a silicon semiconductor substrate which is obtained from a silicon single crystal grown by the CZ method. It is required to contain crystal defects measuring not less than 0.1 μm as reduced to diameter at least in the region reaching a depth of 1 μm from the surface of the substrate at a density of not more than $10^4$ pieces/cm$^3$.

We have conducted a study of the crystal defects occurring in the region for manufacture of devices on a silicon semiconductor substrate and have consequently discovered that the defects which induce structural destruction of the devices without fail have sizes of not less than 0.1 μm as reduced to diameter and that the defects of smaller sizes constitute themselves no obstacle. Then, in the manufacture of devices on the silicon semiconductor substrate, since the defects occurring at least in the region reaching a depth of 1 μm from the surface of the substrate largely affect the yield of the devices, successful removal of the defects harmful to the devices from at least the region reaching a depth of 1 μm from the surface of the substrate results in substantially exalting the yield of devices to be manufactured on the substrate. As respects the density of defects, a volumetric density of not more than $10^4$ pieces/cm$^3$ is regarded as a nearly satisfactory defect density in consideration of the prevalent sizes of the existing devices because this density equals the ratio of one defect to a region of 1 cm×1 cm×1 μm.

Further, the silicon semiconductor substrate of this invention is preferred to contain nitrogen at the center of thickness of the substrate at a density of not less than $1\times10^{13}$ atoms/cm$^3$ and not more than $1\times10^{16}$ atoms/cm$^3$, more favorably not less than $5\times10^{13}$ atoms/cm$^3$ and not more than $1\times10^{16}$ atoms/cm$^3$, and still more favorably not less than $5\times10^{14}$ atoms/cm$^3$ and not more than $1\times10^{16}$ atoms/cm$^3$. By introducing nitrogen into the silicon single crystal, the concentration of point defects and the behavior of aggregation of point defects during the growth of a crystal are varied, the void defects in the crystal are deformed, and an oxygen precipitate is made to occur at a density of not less than $10^7$ pieces/cm$^3$. The deformed void defects possibly occur at a density of not more than 5% of the density of the oxygen precipitates, depending on the pulling condition of the operation of pulling. If the nitrogen content in the substrate is less than $1\times10^{13}$ atoms/cm$^3$, the void defects will not be easily deformed. If it exceeds $1\times10^{16}$ atoms/cm$^3$, dislocation will readily enter the substrate during the growth of the crystal and nitrogen will possibly form compound defects with oxygen and possibly vary the resistance of the substrate and further a heat treatment will tend to give rise to stacking faults. The nitrogen content in the substrate can be determined by using the secondary ion mass spectroscopy (SIMS).

Further in this invention, the silicon semiconductor substrate mentioned above is preferred to be such that the nitrogen content thereof is not more than $1\times10^{16}$ atoms/cm$^3$, particularly not less than $1\times10^{13}$ atoms/cm$^3$ and not more than $1\times10^{16}$ atoms/cm$^3$, and such that when the nitrogen concentration thereof is determined throughout the entire volume of the substrate by the method of secondary ion mass analysis a part locally nitrogen concentrated by a nitrogen segregation exhibiting a signal intensity of not less than twice the average signal intensity is found. The nitrogen which is introduced during the growth of the crystal is not necessarily distributed uniformly in the crystal. Depending on the condition for the growth of the crystal, there are times when the average nitrogen concentration will be found to be increased by the local segregation concentration of nitrogen or the local signal intensity to be exalted by a magnitude of not less than twice the lowest measurable level. This increase may be observed when the average nitrogen concentration determined by the SIMS, for example, is less than $1\times10^{16}$ atoms/cm$^3$ or below the lowest measurable level. Even in this case, the aggregation of point defects during the growth of a crystal is repressed and the formation of an oxygen precipitate is advanced fully satisfactorily and the defects can be easily abolished by the subsequent annealing.

The oxygen precipitate which has been formed in consequence of the doping of nitrogen can be abolished in the neighborhood of the surface of the substrate by causing the density of oxygen to be distributed in such a manner that the oxygen concentration decreases from the center of thickness of the substrate toward the surface thereof. Then, it is necessary that the density distribution allowing the crystal defects to decrease from the center of thickness of the substrate toward the surface thereof be formed and the volumetric density of crystal defects measuring not less than 0.1 μm as reduced to diameter at a depth of 0.1 μm from the surface of the substrate be lowered by not less than two places of decimal (not more than 1%) as compared with that existent at the center of thickness of the substrate. The surface density of crystal defects measuring not less than 0.1 μm as reduced to diameter on the outermost surface of the substrate can be decreased to not more than 1 piece/cm$^2$ by a heat treatment in a non-oxidizing atmosphere or by polishing the surface. If this density of crystal defects (mainly an oxygen precipitate) is surpassed, the structural breakage of devices will be easily induced and the yield of devices manufactured on the substrate will be degraded.

The method for producing the silicon semiconductor substrate of the quality described above does not need to be particularly discriminated but has only to be capable of obtaining a substrate satisfying the conditions mentioned above by the CZ method.

The CZ method, as universally known, comprises fusing a raw material formed of polycrystalline silicon and optionally added substances such as a dopant and seated in a crucible typically made of quartz thereby preparing fused silicon and temporarily immersing a seed crystal formed of a silicon single crystal into the fused silicon and then pulling it up thereby inducing growth of a silicon single crystal at the trailing end of the seed crystal. Immediately after the start of growth, the silicon single crystal being grown is temporarily constricted diametrically so as to be deprived of dislocation, then expanded till a required diameter by gradually lowering the pulling speed and/or the temperature of the fused silicon, and thereafter left growing till a required weight or a required length meanwhile allowed to maintain a required diameter. In this invention, the CZ method to be used for producing the silicon single crystal of the quality described above does not need to be limited to the CZ method of ordinary type. The present invention, when necessary, allows use of any of the conventional CZ methods which, like the CZ method entailing application of a magnetic field, annex various additive requirements. The fact that various known cooling devices, heat insulating devices, and heating devices may be used for the purpose of setting the condition for cooling the single crystal during the course of the lifting operation as required and the fact that various known applied techniques in the CZ method such as the technique for controlling the diameter, the technique for controlling the temperature distribution, the technique for controlling the flow of the fused silicon, and the technique for controlling the atmosphere may be utilized without departure from the scope and spirit of the present invention may be readily understood by any person of ordinary skill in the art.

The various conditions such as the speed of pulling the single crystal, the rotational speeds of the single crystal and the crucible, the gas for the atmosphere, the pressure, and the magnetic field for application do not need to be particularly restricted. To cite a typical set of production conditions solely for the sake of reference, the speed of pulling the single crystal is in the approximate range of 1.0–2.0 mm/minute, the rotational speed of the single crystal is in the range of 0.1–30 rpm, the rotational speed of the crucible is in the approximate range of 0.1–30 rpm (incidentally, the single crystal and the crucible are rotated in opposite directions), the gas for the atmosphere is Ar gas, the flow volume of the gas is in the approximate range of 50–300 liters/minute, the pressure in the furnace is in the approximately range of 20–70 Torrs, the magnetic field optionally applied is selected from among lateral magnetic field, longitudinal magnetic field, and cusped magnetic field, and the intensity of magnetic field is in the approximate range of 0–400 gausses. As specifically mentioned above, this invention does not need to be limited to these production conditions in any sense.

For the purpose of producing the silicon semiconductor substrate of this invention efficiently with fully satisfactory productivity, however, it is preferable to obtain a silicon semiconductor substrate from a silicon single crystal grown by the CZ method using a molten silicon containing nitrogen at a concentration of not less than $1\times10^{16}$ atoms/cm$^3$ and not more than $1.5\times10^{19}$ atoms/cm$^3$ and heat-treat this silicon semiconductor substrate at a temperature of not less than 1000° C. and not more than 1300° C. for not less than one hour. The doping of nitrogen to the silicon single crystal being grown may be attained byamethod of flowing a stream of nitrogen gas into the raw material being fused or a method of causing a silicon wafer having a nitride deposited thereon as by the CVD method to mingle into the raw material being fused, for example. The coefficient of segregation of the nitrogen incorporated in a solidified crystal is $7\times10^{-4}$ as reported in W. Zulehner and D. Huber; Crystals 8—Growth, Properties, and Applications—, p. 28 (Springer-Verlag, New Yor, 1982). A crystal containing not less than $1\times10^{13}$ atoms/cm$^3$ and not more than $1\times10^{16}$ atoms/cm$^3$ of nitrogen can be grown by using a fused silicon containing not less than $1\times10^{16}$ atoms/cm$^3$ and not more than $1.5\times10^{19}$ atoms/cm$^3$ of nitrogen.

In growing a crystal by the CZ method, by growing the crystal from a molten silicon containing nitrogen at a concentration of not less than $1\times10^{16}$ atoms/cm$^3$ and not more than $1.5\times10^{19}$ atoms/cm$^3$ under the condition using a V/G value of not less than 0.2 (mm$^2$/°C.min), providing that V (mm/min) denotes the pulling speed and G (°C./mm) the average value of the temperature gradient in the crystal in the axial direction of pulling in the range of temperature from the melting point of silicon to 1300° C. (the conditions, in the ordinary pulling furnace, corresponding to an approximate pulling speed of not less than 1.5 mm/min and a nitrogen concentration in the crystal of not less than $1\times10^{13}$ atoms/cm$^3$ and not more than $1\times10^{16}$ atoms/cm$^3$) and using a semiconductor substrate manufactured from the crystal, the depth of the surface region having no defect, i.e., DZ, can be increased to not less than 1 µm.

Since the crystal which has contained nitrogen as described above has generated an oxygen precipitate, it can be nearly completely deprived of defects only by expelling the oxygen from the surface of the wafer by diffusion. The deformed void defects have unstable shapes and are easily disappeared by a heat treatment. In contrast, the conventional crystal requires the void defects present therein to be disappeared. Since this disappearance entangles itself with absorption and emission of point defects of silicon and precipitation and emission of oxygen in the crystal, the heat treatment involved therein has a complicated pattern. The heat treatment requires a high temperature approximating closely to 1200° C. The disappearance cannot be attained completely unless such a dangerous gas as hydrogen is used for the atmosphere. The proper temperature of the heat treatment of this invention is not less than 1000° C. and not more than 1300° C., preferably not less than 1100° C. and not more than 1200° C. If this temperature is unduly low, the out-diffusion of oxygen necessitates a great length of time. If it is unduly high, the thermally equilibrated oxygen solid solubility in the crystal will increase to the extent of disabling the out-diffusion of oxygen. If the temperature exceeds 1150° C., the problem of coarsening the surface of the substrate will gain in severity proportionately to the rise of temperature. Generally, when the heat-treating furnace is operated at a high temperature, the furnace proper tends to be polluted unexpectedly. To diminish this danger, the temperature of the heat treatment is preferred to be lowered to the fullest possible extent. It is, therefore, preferable to perform the heat treatment at the lowest possible temperature within the range mentioned above with due respect to the depth of the DZ needed and the duration of time allowed for the heat treatment from the economic point of view.

Since the wafer of this invention allows the oxygen precipitate occurring therein to be grown by a heat treatment, the heat-treated wafer is enabled to acquire therein a gettering layer of high density. Usually, the so-called IG wafer furnished on the surface with the DZ and in the interior thereof with the gettering layer of high density can be manufactured solely by three stages of heat treatment (out-diffusion of oxygen+formation of an oxygen precipitate nuclei+formation of an oxygen precipitate). When the method of production contemplated by this invention is used, a wafer which is furnished on the surface with a DZ of higher perfectivity than the conventional IG wafer and in the interior with a gettering layer of high density can be manufactured by one round of heat treatment.

The atmosphere for the heat treatment is preferred to be a non-oxidizing atmosphere which is capable of effectively decreasing the oxygen concentration on the surface of a wafer and consequently attaining easy disappearance of plate precipitates formed in consequence of the nitrogen doping. The non-oxidizing gas is preferred to be argon gas from the viewpoint of economy. The use of helium gas is at an advantage in decreasing the content of impurities, particularly the amount of impurity oxygen in the gas. The helium gas, however, entails such problems as sacrificing economy and rendering difficult the handling of the heat-treating furnace due to the high thermal conductivity of helium. Though other rare gases (neon, xenon, etc.) are also usable, they are more expensive than argon. Nitrogen gas is unsuitable because it forms a nitride on the surface of the substrate. Though such a reducing atmosphere as hydrogen is usable because it is equal in effect to argon gas, it does not necessarily deserve to be call suitable because it is at a disadvantage in allowing no easy handling and particularly threatening danger of explosion.

It ought to be added that the amount of impurities suffered to enter the wafer under heat treatment must be decreased to the fullest possible extent. This necessity is aptly pointed out in Japanese Patent Application No. 09-297,158. It is further pointed out therein that the completeness of the crystal in the surface layer can be exalted by decreasing impurities. This effect may be utilized for smoothing those COP pits which are present on the surface of the crystal prior to a heat treatment.

For the sake of reference, the pertinent contents of Japanese Patent Application No. 09-297,158 will be summarized below. The following contents are incorporated in the present specification on account of connection.

As respects the concentration of impurities in the atmosphere for the heat treatment, it is necessary for the purpose of effectively decreasing such crystal defects as COP that the content of impurities be not more than 5 ppm. As concrete examples of typical impurities, water, oxygen, and nitrogen may be cited. If the content of such impurities is larger than 5 ppm, the decrease of crystal defects will not be attained fully satisfactorily and the substrate will suffer the surface thereof to be inevitably coarsened. Even though the non-oxidizing gas itself has the purity thereof heightened, it generally happens in the actual operation of a furnace that the concentration of impurities within the furnace possibly increases because the ambient air is drawn in through the mouth of the furnace during the insertion of a semiconductor substrate into the furnace. For the purpose of preventing this accident, therefore, it is necessary that the interior of the furnace be enabled to be filled prior to the insertion of the substrate therein with a non-oxidizing gas, preferably argon gas, having a concentration of impurities of not more than 5 ppm by providing the apparatus at the mouth of the furnace with a purge box or a load lock chamber. The effect which decreases the defects as mentioned above is inferred to originate in the following function. Specifically, the oxygen concentration on the surface of the substrate can be lowered by the heat treatment in the atmosphere of a non-oxidizing gas. In consequence of this decrease in the oxygen concentration on the surface, the oxygen precipitate contained in the DZ is dissolved out till distinction. The void defects in the crystal which are called COP, in consequence of the decrease in the oxygen concentration of the DZ, is deprived of the oxygen which has stabilized the inner surface of the void defects and is inevitably compelled to destabilize the inner surface, with the result that the void defects will be abolished by the diffusion of silicon atoms. Since the oxygen concentration on the surface is lowered in a great measure by decreasing the amount of impurities, particularly oxygen and water, in the non-oxidizing gas, the oxygen precipitate and such crystal defects as COP can be decreased markedly by exalting the purity of the non-oxidizing gas.

As the atmosphere of a gas, an atmosphere containing not less than 0.01 vol. % and not less than 100 vol. % of oxygen may be used instead of the non-oxidizing atmosphere. In this case, however, the surface must be polished again. As one merit of this inclusion of oxygen in the atmosphere, the fact that the management of such impurities as water which are suffered to mingle into the crystal under heat treatment can be slackened may be cited. As a concrete example of the atmosphere, the gas obtained by mixing such an inert gas as argon with oxygen is used. The amount of the oxygen to be used in the mixture is preferred to be on the order of several %. It is permissible to use 100 vol. % of oxygen gas instead. If the amount of the oxygen to be used for this mixture is less than 0.01 vol. %, the incorporation of oxygen no longer has any merit because the entry of such impurities as water into the atmosphere must be controlled strictly. On the surface of the wafer which has undergone the heat treatment, the oxide film produced during the heat treatment causes the marks of crystal defects to manifest themselves like pits of chemical etching. This fact explains why the surface must be polished again. For perfect removal of the marks of defects, the surface must be polished in a depth of not less than 0.5 $\mu$m. If the depth removed by the repeated polish is larger than 1.0 $\mu$m, the denuded surface layer containing crystal defects measuring not less than 0.1 $\mu$m as reduced to diameter at a density of not more than $10^4$ pieces/cm$^3$ will encounter difficulty in increasing the thickness thereof to not less than 1 $\mu$m.

By subjecting the crystal which has incorporated nitrogen therein during the course of growth thereof to the heat treatment described above, it is made possible to obtain a DZ which has the density of defects decreased to a level at least on a part with and has acquired a depth greater than the conventional annealed wafer under the conditions of heat treatment simpler, safer, and less possible of process pollution than ever.

Now, the epitaxial silicon substrate of this invention according to the second aspect will be described in detail below.

The silicon semiconductor substrate of the first mode of this invention according to this second aspect is a silicon semiconductor substrate which is obtained by using as a substrate wafer a silicon wafer having a nitrogen content of not less than $1.0 \times 10^{13}$ atoms/cm$^3$ and not more than $1.0 \times 10^{16}$ atoms/cm$^3$ and depositing on the surface of the substrate wafer a silicon single crystal layer by the epitaxial method.

For the purpose of repressing the occurrence of minute pits on the surface of the silicon wafer without varying the electrical characteristics of the wafer or inducing the occurrence of such defects as stacking faults during the course of heat-treating devices, it is necessary that the nitrogen content in the silicon wafer be not less than $1.0 \times 10^{13}$ atoms/cm$^3$ and not more than $1.0 \times 10^{16}$ atoms/cm$^3$. Then, by using the silicon wafer of this description as a substrate wafer and depositing a silicon single crystal layer on the surface of the substrate wafer by the epitaxial method, the occurrence of minute defects and void defects in the epitaxial layer or near the interface between the epitaxial layer and the substrate wafer mentioned above is repressed and, at the same time, the silicon semiconductor substrate to be produced is enabled to have suitable crystal defects in the wafer interior and enjoy a fortified gettering ability. If the nitrogen content in the silicon wafer is less than $1.0 \times 10^{13}$ atoms/cm$^3$, the occurrence of minute pits on the surface of the wafer will not be repressed. If it exceeds $1.0 \times 10^{16}$ atoms/cm$^3$, the silicon semiconductor substrate of fine quality will not be obtained by depositing the epitaxial layer because of the variation of such electrical characteristics as carrier life time and resistivity and the occurrence of stacking faults. Incidentally, the nitrogen content in the wafer can be determined by using SIMS as described above.

The silicon semiconductor substrate of the second mode of this invention according to the second aspect is a silicon semiconductor substrate obtained by using as a substrate wafer a silicon wafer having an oxygen content of not less than $1.0 \times 10^{17}$ atoms/cm$^3$ and depositing a silicon single crystal layer on the surface of the substrate wafer by the epitaxial method and is characterized by containing at least in a region reaching a depth of 1 $\mu$m from the interface between the substrate wafer mentioned above and the silicon single crystal layer deposited thereon by the epitaxial method crystal defects measuring not less than 0.1 $\mu$m as reduced to diameter at a density of not more than $5 \times 10^4$ pieces/cm$^3$.

The silicon substrate having an oxygen concentration of not less than $1.0 \times 10^{17}$ atoms/cm$^3$ can be manufactured by the CZ method which comprises supporting fused silicon as a raw material by a quartz crucible and growing a crystal from the fused silicon. To be specific, the oxygen emanating from the quartz crucible supporting the fused silicon as the raw material is melted into the fused silicon and taken into the single crystal being solidified from the fused silicon. The requested oxygen concentration can be attained by adjusting the revolution number of the crucible, the condition for heating the fused silicon, the flow volume of the gas for the atmosphere, the interior pressure of the pulling furnace, and the intensity of the magnetic field to be applied. Since the mechanical strength of the silicon wafer and the IG ability in the interior of the wafer are degraded when the oxygen content of the silicon wafer is less than $1.0 \times 10^{17}$ atoms/cm$^3$, the silicon wafer to be used requires to have an oxygen content of not less than $1.0 \times 10^{17}$ atoms/cm$^3$. Incidentally, when the silicon wafer contains oxygen, it tends to induce various kinds of crystal defects. A study of the effect of the crystal defects in the silicon wafer on the quality of the epitaxial layer has revealed that the form of presence of the crystal defects in the region reaching a depth of 1 μm from the surface of the silicon wafer used as the substrate for the deposition of the epitaxial layer plays an important role. When the crystal defects measuring not less than 0.1 μm as reduced to diameter are present copiously, they survive the heat treatment performed through the step of epitaxial deposition and the step of device manufacture and tend to constitute themselves the origins for formation of defects in the epitaxial layer. The crystal defects measuring not less than 0.1 μm are mainly void defects. In the conventional silicon wafer, these void defects are present at an approximate density of $10^6$ pieces/cm$^3$ or more. Incidentally, when the density of the crystal defects measuring not less than 0.1 μm in the region mentioned above is not more than $5 \times 10^4$ pieces/cm$^3$, the silicon semiconductor substrate to be produced does not allow occurrence of defects in the epitaxial layer because the former of the two heat treatments performed in the process of epitaxial deposition renders the defects mentioned above harmless by contraction and diffusion till abolition. If the density of crystal defects measuring not less than 0.1 μm in the region mentioned above exceeds $5 \times 10^4$ pieces/cm$^3$, the epitaxial layer will suffer occurrence of defects therein. Particularly when the epitaxial layer has a small thickness of about 1 μm, these defects will entail such problems as causing imperfection of pattern in the process of device manufacture, exerting serious influences on the dielectric breakdown characteristic and the element separation characteristic of the oxide film, and degrading the yield.

The silicon semiconductor substrate according to the third mode of this invention is a silicon semiconductor substrate obtained by using as a substrate wafer a silicon wafer having an oxygen content of not less than $1.0 \times 10^{17}$ atoms/cm$^3$ and depositing a silicon semiconductor substrate on the surface of the substrate wafer by the epitaxial method and is characterized by containing at least in a region reaching a depth of 1 μm from the interface between the substrate wafer mentioned above and the silicon single crystal layer deposited by the epitaxial method crystal defects measuring not less than 20 nm as reduced to diameter at a density of not more than $5 \times 10^5$ pieces/cm$^3$.

The crystal defects measuring not less than 20 nm as reduced to diameter embrace minute oxygen precipitates in addition to minute void defects mentioned above. If these defects are present copiously on the surface of the silicon wafer and in the surface layer region, the crystal defects mentioned above will be propagated and transferred from the silicon wafer used as the substrate wafer during the epitaxial growth into the epitaxial layer or they induce origination of new defects from the crystal defects mentioned above into the epitaxial layer. In the conventional silicon wafer intended for use as a substrate wafer, these minute defects used to be present at a density of about $10^7$ pieces/cm$^3$. So long as the density of crystal defects measuring not less than 20 nm as reduced to diameter is not more than $5 \times 10^5$ pieces/cm$^3$ at least in a region reaching a depth of 1 μm from the surface of the silicon wafer being used as the substrate wafer, the silicon semiconductor substrate to be produced is not allowed to induce new defects in the interior of the epitaxial layer because the surface cleaning treatment performed in the process of epitaxial deposition and the high-temperature heating treatment in the process of deposition of the epitaxial layer render the defects mentioned above harmless by decomposition till abolition. If the region mentioned above contains crystal defects measuring not less than 20 nm as reduced to diameter at a density exceeding $5 \times 10^5$ pieces/cm$^3$, owing to the unduly large amount of defects to be decomposed by the heat treatment, the vacancies and the oxygen impurities to be formed in consequence of the decomposition will be diffused and suffered to persist in the epitaxial layer, with the result that new crystal defects will be induced and formed in the epitaxial layer during the course of the heat treatment in the process of device manufacture and suffered to cause degradation of the yield of the device manufacture.

The fourth mode of this invention, which combines the features of the second and the third mode of this invention, concerns a silicon semiconductor substrate which is obtained by using as a substrate wafer a silicon wafer having an oxygen content of not less than $1.0 \times 10^{17}$ atoms/cm$^3$ and depositing a silicon single crystal layer on the surface of the substrate wafer by the epitaxial method and is characterized by containing at least in a region reaching a depth of 1 μm from the interface between the substrate wafer mentioned above and the silicon single crystal layer deposited thereon by the epitaxial method crystal defects measuring not less than 0.1 μm as reduced to diameter at a density of not more than $5 \times 10^4$ pieces/cm$^3$ and crystal defects measuring not less than 20 nm as reduced to diameter at a density of not more than $5 \times 10^5$ pieces/cm$^3$. Thus, the silicon semiconductor substrate to be produced herein is furnished with a defectless epitaxial layer which is incapable of generating or inducing defects.

The fifth mode of this invention, which unites the second through the fourth mode, concerns a silicon semiconductor substrate which is obtained by using a silicon wafer as a substrate wafer for depositing a single crystal layer thereon by the epitaxial method and incorporating in the silicon wafer not less than $1.0 \times 10^{13}$ atoms/cm$^3$ and not more than $1.0 \times 10^{16}$ atoms/cm$^3$ of nitrogen.

As described in the first mode, the nitrogen in the silicon single crystal, when contained in a prescribed amount, functions to vary the concentration of point defects and the behavior of aggregation of point defects during the growth of the single crystal and manifests an effect of repressing the formation of void defects in the single crystal and an effect of exalting the strength of the substrate. By using this nitrogen-containing silicon wafer as a substrate wafer for depositing a single crystal thereon by the epitaxial method, therefore, the decrease of various defects in the substrate silicon wafer can be facilitated and the provision of a silicon semiconductor substrate furnished with a more perfectively defectless epitaxial layer can be realized.

Then, the sixth mode of this invention is a silicon semiconductor substrate which contains in a region at the center of thickness of a substrate silicon wafer of the first through the fifth mode crystal defects measuring not less than 20 nm as reduced to diameter at a density of not less than $1 \times 10^8$ pieces/cm$^3$. The expression "region at the center of thickness of the substrate silicon wafer" as used herein refers to the region which is deeper than 1 μm from the surface of the substrate wafer, preferably not less than 20 μm toward the interior. By allowing the crystal defects measuring not less than 20 nm as reduced to diameter to exist in the inner region of the substrate wafer at a density of not less than $1 \times 10^8$ pieces/cm$^3$, it is made possible to impart effectively the gettering ability to cope efficiently with the increase of process pollution attendant on the integration of devices and realize the provision of a silicon semiconductor substrate enjoying a fully satisfactory yield of device manufacture.

Incidentally, the first through the six mode of the invention described above are established without reference to the magnitudes of resistivity of the pertinent silicon wafers. They can be manifested as required by fulfilling the respective conditions indicated above.

Now, the methods for producing the silicon semiconductor substrate mentioned above efficiently with high productivity will be described below. It is provided, however, that in the production of the silicon semiconductor according to the second aspect of this invention, the method for producing the substrate wafer for deposition of a single crystal thereon by the epitaxial method does not need to be specifically restricted but is only required to be capable of obtaining a wafer which satisfies the conditions mentioned above in connection with the CZ method, similarly to the silicon semiconductor substrate according to the first aspect mentioned above.

Specifically, the method for producing the silicon semiconductor substrate of the first mode of this invention according to the second aspect comprises using as a substrate wafer a silicon wafer obtained from a silicon single crystal grown by the CZ method using a molten silicon containing not less than $1.0 \times 10^{16}$ atoms/cm$^3$ and not more than $1.5 \times 10^{19}$ atoms/cm$^3$ of nitrogen and depositing a silicon single crystal layer on the surface of the substrate wafer by the epitaxial method.

This method is implemented by growing a silicon single crystal ingot by the CZ method using a molten silicon containing not less than $1.0 \times 10^{16}$ atoms/cm$^3$ and not more than $1.5 \times 10^{19}$ atoms/cm$^3$ of nitrogen, slicing the ingot, polishing a produced slice of ingot till a mirror surface thereby preparing a silicon wafer, using the silicon wafer as a substrate wafer, and growing a silicon single crystal layer on the surface thereof by the epitaxial method. The method for nitrogen doping to the silicon single crystal being grown and the segregation coefficient of the nitrogen to be incorporated in the solidified crystal are as described above; By growing the crystal from the molten silicon having the aforementioned nitrogen concentration, it is made possible to produce a silicon wafer containing not less than $5.0 \times 10^{13}$ atoms/cm$^3$ and not more than $1.0 \times 10^{16}$ atoms/cm$^3$ of nitrogen. The method of epitaxial growth may be carried out with an apparatus for vapor growth. Generally, the method comprises elevating the temperature of the substrate wafer in an atmosphere of hydrogen gas prior to the vapor growth to a prescribed temperature range (generally a fixed temperature in the range of 900° C. to 1200° C.), subsequently etching the substrate wafer with a gas containing hydrogen chloride for several minutes, purging the etched surface of contamination and activating the wafer surface, and thereafter growing an epitaxial thin film on the surface of the water with a silane-based gas.

In the silicon crystal which has been grown so as to contain therein nitrogen at a concentration of not less than $1.0 \times 10^{13}$ atoms/cm$^3$ and not more than $1.0 \times 10^{16}$ atoms/cm$^3$, the nitrogen varies the concentration of point defects and the behavior of point defects during the growth of crystal and prohibits occurrence of void defects represented by COP which measure about 0.1 $\mu$m or more in the crystal as described in connection with the invention according to the first aspect. Generally, the crystal in growth forms void defects when the temperature of the crystal is at a relatively high level in the approximate range of 1150° C.–1050° C. When this crystal is made to contain nitrogen in a prescribed amount, the nitrogen decreases the void defects mentioned above by repressing aggregation of vacancies. The nitrogen meanwhile promotes formation of nuclei of oxygen precipitates at a low temperature in the range of 1000° C.–450° C. and gives rise to minute oxygen precipitates dispersed at a high density. Particularly, the minute oxygen precipitates in the nitrogen-containing silicon wafer form unstable precipitates at elevated temperatures and, at the step of treatment with hydrogen, i.e. the former of the two heat treatments performed in the process for epitaxial growth mentioned above, and at the step of depositing an epitaxlal single crystal, those minute oxygen precipitates which are present in the surface region of silicon wafer are readily decomposed and contracted by the effect of out-diffusion of oxygen. As a result, the region in which minute defects measuring not less than 20 nm as reduced to diameter are contained at a density of not more than $5 \times 10^5$ pieces/cm$^3$ is readily formed not only in the epitaxial layer but also at least in a region reaching a depth of 1 $\mu$m from the surface of the substrate wafer prior to the deposition of the epitaxial layer. Meanwhile, the minute oxygen precipitates incorporated in the interior of the substrate, unlike those which are present near the surface of the substrate, do not decompose till disappearance on account of out-diffusion of oxygen, survive the process of deposition of an epitaxial layer and persist at a density of not less than $1 \times 10^8$ pieces/cm$^3$ without being thoroughly dissolved and abolished, grow during the heat treatment performed in the process of device manufacture, induce such crystal defects as are effective against the IG action, and permit production of a silicon semiconductor substrate having the IG effect conspicuously enhanced as compared with the conventional counterpart.

Then, the method for producing the silicon single substrate of the second mode of this invention resides in using as a substrate wafer for the growth of an epitaxial single crystal a silicon wafer which is produced by causing a silicon single crystal being grown by pulling a silicon single crystal in accordance with the CZ method to be cooled through a crystalline temperature range from the silicon solidifying point to 800° C. at a cooling speed of not less than 2.0° C./minute.

The fact that the silicon single crystal being grown by pulling is quenched through a range from the solidifying point to 800° C. at a speed of not less than 2.0° C./minute results in repressing aggregation of point defects and reducing void defects. It also represses formation of nuclei of oxygen precipitates in the range of temperature mentioned above, namely it represses occurrence of stable oxygen precipitates at an elevated temperature. As a result, it is made possible to decrease void defects measuring not less than 0.1 $\mu$m as reduced to diameter and decrease minute defects measuring not less than 20 nm as well in the surface region of the substrate silicon wafer (namely the region of the interface between the epitaxial layer and the substrate wafer) during the process for epitaxial growth.

The method for producing a silicon semiconductor substrate of the third mode of this invention consists in using as a substrate wafer for the growth of an epitaxial single crystal a silicon wafer which is produced by causing a silicon single crystal being grown by pulling a silicon single crystal in accordance with the CZ method to be cooled through a crystal temperature range from 800° C. to 400° C. at a cooling speed of not less than 1.0° C./minute.

The fact that the silicon single crystal being grown by pulling is quenched through a range of temperature from 800° C. to 400° C. at a speed of not less than 1.0° C./minute results in preventing void defects from being internally oxidized and varied into stable oxides and consequently destabilizing void defects against a heat treatment. It increases the density of nuclei and promotes fine division and dispersion of the oxygen precipitates, although it curbs the speed of formation of nuclei of oxygen precipitates. By using the silicon wafer produced by this method as a substrate wafer and effecting epitaxial growth on the substrate wafer, it is made possible to decrease void defects measuring not less than 0.1 μm as reduced to diameter and decrease minute defects measuring not less than 20 nm in the surface region of the silicon wafer (namely, the region of the interface between the epitaxial layer and the substrate wafer) during a high-temperature heat treatment in the process of epitaxial growth and allow production of a silicon semiconductor substrate which forms in the interior of the silicon substrate minute defects of high density capable of enhancing the IG ability.

The method for producing a silicon semiconductor substrate of the fourth mode of this invention, which combines the effect of quenching through the region from the solidifying point to 800° C. and the effect of quenching from 800° C. to 400° C., consists in using as a substrate wafer for the growth of an epitaxial single crystal a silicon wafer which is produced by causing a silicon single crystal being grown by pulling a silicon single crystal in accordance with the CZ method to be cooled through a range of crystalline temperature from the solidification point to 800° C. to at a cooling speed of not less than 2.0° C./minute and continuing the cooling through a range from 800° C. to 400° C. at a cooling speed of not less than 1.0° C./minute. By this method, the void defects and the oxygen precipitates in the surface layer region of the substrate silicon wafer, namely the region of the interface between the epitaxial layer and the substrate wafer, are further divided finely and destabilized, the decreasing effect is exhibited in the process of epitaxial growth, and the interior of the substrate silicon wafer allows occurrence of crystal defects of high density which fortify the IG effect in the process of device manufacture. The enhancement of the cooling effect of the single crystal silicon ingot during the growth by pulling generally results in heightening the cooling ability in the solidifying interface and further proves effective in increasing the speed of growth of crystal, improving the productivity of crystal, and lowering the cost of production.

The method for producing a silicon semiconductor substrate of the fifth mode of this invention concerns a method for producing a substrate silicon wafer by combining the technique for nitrogen doping according to the first mode and the technique for varying the conditions for cooling a silicon crystal during growth by pulling according to the second through the fourth mode. Owing to the synergism between the effect of nitrogen doping and the effect of quenching the crystal being pulled, this method produces an epitaxial silicon substrate which brings an effect of conspicuously facilitating the disappearance of crystal defects on the surface of the substrate silicon wafer prior to the epitaxial growth and an effect of further increasing the density of crystal defects in the substrate silicon wafer as well.

The method for producing a silicon semiconductor substrate of the sixth mode concerns a method which comprises subjecting a nitrogen doped substrate wafer and an oxygen-containing substrate wafer mentioned above, further a substrate wafer reflecting variation in the conditions for cooling a crystal being pulled, and a substrate wafer obtained by combining the procedures employed thereof respectively to a high-temperature heat treatment prior to the epitaxial growth for the purpose of promoting more thoroughly the elimination of defects from the surface of the substrate wafer thereby conferring prominence on the difference in density of crystal defects between the surface and the interior of the wafer. The suitable temperature of the heat treatment is not less than 1000° C. and not more than 1300° C., preferably not less than 1100° C. and not more than 1200° C. If the temperature is unduly low, the external diffusion of oxygen and vacancies will spent time copiously. If the temperature is unduly high, the thermal equilibrium oxygen solid solubility or the thermal equilibrium vacancy concentration in the crystal will increase and the external diffusion of oxygen and vacancies will tend to occur. Above the level of 1150° C., the problem of coarsening the surface of the substrate wafer grows in gravity in proportion as the temperature rised. Generally, when the heat-treating furnace is operated at an elevated temperature, the furnace proper tends to succumb to pollution unexpectedly. To abate this danger, the temperature of the heat treatment is preferred to be lowered to the fullest possible extent. The heat treatment, therefore, is preferred to proceed at the lowest possible temperature to be selected in the aforementioned range in due consideration the depth of the defectless layer necessary for the surface region of the substrate wafer prior to the epitaxial growth and the length of time allowed for the heat treatment from the viewpoint of economy.

We have been ascertained by our own study that on the substrate silicon wafers obtained by the methods of production embodying the first through the sixth mode of this invention according to the second aspect for use in the epitaxial growth of a single crystal layer, the heat treatment performed under the aforementioned temperature conditions for a period of not less than 5 minutes enables a substantially perfect defectless region to be formed in the surface layer part of the substrate silicon wafer. This heat treatment may be performed in an oxidizing atmosphere. For the sake of eliminating the formation of an oxide film which is unnecessary for the deposition of an epitaxial layer, however, the heat treatment is preferred to be performed in a non-oxidizing atmosphere.

By using a crystal made to contain nitrogen in a suitably controlled concentration during the growth thereof, a crystal further adding oxygen, a crystal reflecting control of the conditions for cooling the crystal being grown, a crystal reflecting combination of the procedures used thereof, and a crystal resulting from performing a suitable heat treatment on any of the these crystals prior to the epitaxial growth respectively as a substrate wafer for the epitaxial growth and producing an epitaxial silicon single crystal substrate with the substrate wafer, it is made possible to obtain a silicon semiconductor substrate precluding occurrence of defects in the epitaxial layer and the interface between the epitaxial layer and the substrate, exhibiting a higher quality then ever, and acquiring a gettering ability generously in the substrate more simply and easily than ever, namely without requiring to perform the heretofore known multi-stage or complicated annealing prior to the deposition of an epitaxial layer, and at a low cost.

Figure 2:
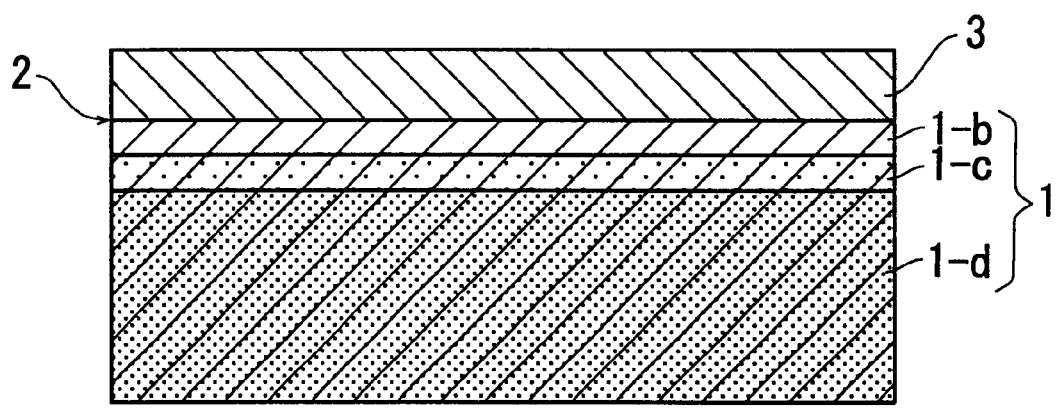
FIG. 2 is another example of the conceptual sectional view of the silicon semiconductor substrate of the present invention.

An conceptual sectional view of the silicon semiconductor substrate of this invention resulting from depositing an epitaxial layer on a nitrogen-doped substrate silicon wafer is depicted in FIG. 1. As shown in FIG. 1, an epitaxial layer 3 is deposited on a nitrogen-doped substrate silicon wafer 1a composed of an IG layer 1d, a region 1c of gradually varying defect density, and a denuded zone 1b through an epitaxial layer/substrate wafer interface 2. An conceptual sectional view of the silicon semiconductor substrate using as a substrate wafer a silicon wafer (without nitrogen doping) produced under specific conditions during the course of pulling a crystal and depositing an epitaxial layer on the surface of the substrate wafer is depicted in FIG. 2. As shown in FIG. 2, an epitaxial layer 3 is deposited on a substrate silicon wafer 1 composed of an IG layer 1d, a region 1c of gradually varying defect density, and a denuded zone 1b through an epitaxial layer/substrate wafer interface 2.

EXAMPLES

Now, this invention will be described more specifically below based on working examples. It should be noted, however, that this invention is not limited in any respect by these working examples.

Referential Examples 1–8

By way of referential examples, the following eight crystals were pulled by the Czochralski method. The oxygen concentrations of these crystals were in the approximate range of $6.5$–$8.5 \times 10^{17}$ atoms/cm$^3$ (determined by the infrared absorption method using the JEIDA conversion factor). They were invariably P-type 10 Ωcm crystals which were obtained by melting respective raw materials each weighing about 40 kg and pulling the molten masses into ingots, 155 mm in diameter and about 30 kg in weight. The doping of nitrogen was effected by preparing a wafer having a nitride film formed by the CVD method on a non-dope silicon crystal and dissolving the wafer at the same time that the relevant raw material was dissolved.

1) A crystal, adding no nitrogen, was grown by pulling at a speed of 1 mm/min.
2) From a raw material prepared in a molten state having added nitrogen at a concentration of $7 \times 10^{15}$ atoms/cm$^3$, a crystal was grown by pulling at a speed of 1 mm/min. The V/G at this time was 0.15 (mm$^2$/°C.min). When the crystal was tested for nitrogen concentration by the SIMS, no nitrogen was detected (which implies that the nitrogen concentration was not more than $1 \times 10^{14}$ atoms/cm$^3$). By calculation from the equilibrium segregation factor, this crystal was found to contain nitrogen at a concentration of about $5 \times 10^{12}$ atoms/cm$^3$.
3) From a raw material prepared in a molten state having added nitrogen at a concentration of $5 \times 10^{16}$ atoms/cm$^3$, a crystal was grown by pulling at a speed of 1 mm/min. The V/G at this time was 0.15 (mm$^2$/°C.min). When the crystal was tested for nitrogen concentration by the SIMS, no nitrogen was detected (which implies that the nitrogen concentration was not more than $1 \times 10^{14}$ atoms/cm$^3$). By calculation from the equilibrium segregation factor, this crystal was found to contain nitrogen at a concentration of about $4 \times 10^{13}$ atoms/cm$^3$.
4) From a raw material prepared in a molten state having added nitrogen at a concentration of $3 \times 10^{17}$ atoms/cm$^3$, a crystal was grown by pulling at a speed of 1 mm/min. The V/G at this time was 0.15 (mm$^2$/°C.min). By calculation from the equilibrium segregation factor, this crystal was found to contain nitrogen at a concentration of about $2 \times 10^{14}$ atoms/cm$^3$. When the crystal was tested for nitrogen concentration by the SIMS, although no determination of nitrogen was achieved, a local increase of nitrogen signal with an intensity not less than twice the background level of nitrogen was perceived.
5) From a raw material prepared in a molten state having added nitrogen at a concentration of $5 \times 10^{17}$ atoms/cm$^3$, a crystal was grown by pulling at a speed of 1 mm/min. The V/G at this time was 0.15 (mm$^2$/°C.min). When the crystal was tested for nitrogen concentration by the SIMS, this crystal was found to contain nitrogen at a concentration of about $5 \times 10^{14}$ atoms/cm$^3$. During the SIMS test, a local increase of nitrogen concentration by not less than twice the average nitrogen signal was perceived.
6) From a raw material prepared in a molten state having added nitrogen at a concentration of $5 \times 10^{17}$ atoms/cm$^3$, a crystal was grown by pulling at a speed of 2 mm/min. The V/G at this time was 0.3 (mm$^2$/°C.min). When the crystal was tested for nitrogen concentration by the SIMS, this crystal was found to contain nitrogen at a concentration of about $5 \times 10^{14}$ atoms/cm$^3$. During the SIMS test, a local increase of nitrogen concentration by not less than twice the average nitrogen signal was perceived.
7) From a raw material prepared in a molten state having added nitrogen at a concentration of $5 \times 10^{17}$ atoms/cm$^3$, a crystal was grown by pulling at a speed of 1 mm/min. The V/G at this time was 0.15 (mm$^2$/°C.min). When the crystal was tested for nitrogen concentration by the SIMS, this crystal was found to contain nitrogen at a concentration of about $5 \times 10^{15}$ atoms/cm$^3$. During the SIMS test, a local increase of nitrogen concentration by not less than twice the average nitrogen signal was perceived.
8) From a raw material prepared in a molten state having added nitrogen at a concentration of $2 \times 10^{19}$ atoms/cm$^3$, a crystal was grown by pulling at a speed of 1 mm/min. Though the crystal was transformed into a polycrystal during the course of growth, a single crystal free from dislocation was obtained from the upper part of an ingot obtained by pulling. When the crystal was tested for nitrogen concentration by the SIMS, this crystal was found to contain nitrogen at a concentration of about $1.5 \times 10^{16}$ atoms/cm$^3$. During the SIMS test, a local increase of nitrogen concentration by not less than twice the average nitrogen signal was perceived.

When the wafers manufactured from the crystals mentioned above were tested for COP density, the test produced the results which are shown in Table 1.

Example 1

The wafers of Referential Example 5 and Referential Example 7 were heat-treated under the conditions according to this invention. They were inserted into a furnace at 800° C., then heated at a temperature increasing rate of 10° C./min to 1100° C., retained at this temperature for 8 hours, and left cooling at a temperature decreasing rate of −10° C./min to 800° C. The substrates consequently formed were extracted from the furnace. The gas used for the heat treatment was obtained by receiving argon gas supplied by a cold evaporator and treating it with a purifying device at the point of use. This gas contained impurities at a concentration of not more than 5 ppm. This gas was passed through the site of the heat treatment mentioned and used as an atmosphere for the heat treatment. The substrates, prior to the insertion into the furnace, were purged with a purge box installed in front of the furnace. After the atmosphere keeping the samples waiting in front of the furnace was filled to capacity with argon gas containing impurities at a concentration of not more than 5 ppm, the mouth of the furnace was opened to admit the substrates.

When the heat-treated substrates were cleaved and tested for nitrogen concentration at the center of thickness thereof by the SIMS, the concentration was found to be about $5\times10^{14}$ atoms/cm$^3$.

To evaluate the quality of a DZ on the surface of each of the heat-treated substrates, an oxide film was formed in a thickness of 25 nm on the surface of a given heat-treated substrate in an atmosphere of dry oxygen at 1000° C. and the oxide film was tested for gate oxide integrity(GOI). A polysilicon electrode, 20 mm$^2$ in area, was used for testing the GOI, with the current for the evaluation set at 1 µA. The results of this test are shown in Table 3. The ratio of oxide films which showed the so-called C mode break down, i.e. the GOI of not less than 8 MV which constitutes itself a criterion for conforming article, was 99%. This means that substantially all the oxide films used for the evaluation proved to be conforming articles. This ratio represents improvement in a great measure as compared with the ratio, 20%, obtained of the samples which omitted the heat treatment. The ratio of the samples which showed GOI of not less than 11 MV at a rating current of 100 mA was 95%.

To examine the effect of a heat treatment on the density of defects, separate substrates heat-treated in the same manner as described above were manufactured and washed repeatedly with an aqueous ammonia hydrogen peroxide solution until their surfaces were etched to a total depth of 0.1 µm. From the number of COP's measuring not less than 0.1 µm as reduced to diameter which was increased in consequence of the etching, the density of defects was calculated. The results are shown in Table 2. The density of COP's on the surface after the heat treatment was found to be 14 pieces/wafer, namely about 0.1 pieces/cm$^2$. When the washing with the aqueous ammonia hydrogen peroxide solution was further continued, the number of COP's remained to be 14 pieces/wafer, indicating absence of a discernible increase in the number of COP's. These results imply that the density of crystal defects measuring not less than 0.1 µm as reduced to diameter was less than $10^3$ pieces/cm$^3$.

For the purpose of examining the density of defects in the interior of the DZ of the wafer, the surfaces of the substrates were polished by mirror-surface abrasion to a depth of 1 µm and the polished surfaces were tested for density of COP's. After the mirror-surface abrasion, the density of COP's measuring not less than 0.1 µm was 20 pieces/wafer. After their surfaces were etched to a depth of 0.1 µm by repeating the washing with an aqueous ammonia hydrogen peroxide solution, the density of COP's measuring not less than 0.1 µm was found by testing to be 25 pieces/wafer and the density of crystal defects measuring not less than 0.1 µm as reduced to diameter was found to be about $3\times10^3$ pieces/cm$^3$.

For the purpose of GOI test of a wafer polished to a depth of 1 µm for GOI, the oxide films were tested in the same manner as described above. The ratios of oxide films which showed GOI of not less than 8 MV at a rating current of 1 µA were 95% and 99%. The ratios of oxide films which showed GOI of not less than 11 MV at a rating current of 100 mA were invariably 92%.

For the purpose of determining the density of COP's at a greater depth, the oxide films were further polished by mirror-surface abrasion to a depth of 2 µm (the total depth of 3 µm from the original surface). The density of COP's measuring not less than 0.1 µm in the new surface was found by testing to be 20 pieces/wafer. After the washing with an aqueous ammonia hydrogen peroxide solution was repeated till 0.1 µm in depth of etching in the same manner as above, the density of COP's was found by testing to be 70 pieces/wafer. From these test results, the density of crystal defects measuring not less than 0.1 µm as reduced to diameter was estimated to be $3\times10^4$ pieces/cm$^3$.

For the purpose of determining the density of defects in the interior of a given substrate, the density of defects measuring not less than 0.2 µm as reduced to diameter at the center of thickness of the substrate was determined by the infrared tomography, it was found to be $7\times10^6$ pieces/cm$^3$. The density of defects measuring not less than 0.1 µm was greater. Since the density of defects at a depth of 0.1 µm from the surface of the substrate was less than $10^3$ pieces/cm$^3$, it is noted that the density of defects was not more than 1% of that in the interior of the substrate.

The silicon wafers were not found to contain other kinds of defects such as stacking faults in the interior of the substrate, indicating that they had high quality.

Example 2

The wafers of Referential Example 6 were heat-treated under the conditions conforming to this invention. The same heat treatment as used in Example 1 was performed on the wafers which were manufactured from the crystal of Referential Example 6. When the heat-treated substrates were cleaved and the sections were examined to determine the concentration of nitrogen at the center of thickness of substrate by the SISM, the concentrations were found to be about $5\times10^{14}$ atoms/cm$^3$.

The surfaces of the wafers heat-treated in the same manner as described above were tested for density of COP's measuring not less than 0.1 µm (Table 2), the densities were 12 pieces/wafer, i.e. about 0.1 piece/cm$^2$. After the wafers were washed repeatedly with an aqueous ammonia hydrogen peroxide solution till 0.1 µm in depth of etching, the densities were found by testing to remain at 12 pieces/wafer. These results indicate that the densities of crystal defects measuring not less than 0.1 µm as reduced to diameter on the surfaces of wafers were decreased by the heat treatment to below $1\times10^3$ pieces/cm$^3$.

When the oxide films after the heat treatment were tested for GOI in the same manner as in Example 1 (Table 3), the ratio of oxide films which showed a GOI of not less than 8 MV at a rating current of µA was found to be 99% and the ratio of oxide films which showed a GOI of not less than 11 MV at a rating current of 100 mA to be 95%.

For the purpose of determining the density of defects in the interior of the DZ of each of the wafers, the surface of a given substrate was polished by mirror-surface abrasion to a depth of 1 µm and the polished surface was tested for density of COP's. After the mirror-surface abrasion, the density of COP's measuring not less than 0.1 µm was found to be 10 pieces/wafer. After the surface of the substrate was washed repeatedly with an aqueous ammonia hydrogen peroxide solution till 0.1 µm in depth of etching, the density of COP's measuring not less than 0.1 µm was found by testing to be 10 pieces/wafer. In the region at a depth of 1 µm, the density of crystal defects measuring 0.1 µm as reduced to diameter was found to be less than $1\times10^3$ pieces/cm$^3$.

The oxide film grown on the surface polished till 1 µm in depth of etching was tested for GOI, the ratio of samples showing GOI of not less than 8 MV at a rating current of 1 µA was 99% and the ratio of samples showing GOI of not less than 11 MV at a rating current of 100 mA was 95%. These test results indicate that after the heat treatment, the crystal was in a substantially equal state on the outermost surface and at a depth of 1 μm from the viewpoint of the GOI of the oxide film.

Further, for the purpose of examining the interior of the CZ layer to determine the state of defects, the oxide film was polished by mirror-surface abrasion till 2 μm in depth (3 μm from the initial surface) and the polished surface was tested for density of COP's measuring not less than 0.1 μm, the density was found to be 16 pieces/wafer. After the oxide film was washed repeatedly with an aqueous ammonia hydrogen peroxide solution till the surface thereof was etched to a depth of 0.1 μm, the density was found to be 21 pieces/wafer. The. density of crystal defects measuring not less than 0.1 μm as reduced to diameter, therefore, was estimated to be $3 \times 10^3$ pieces/cm³. As respects the magnitude of the GOI of the oxide film, the ratio of samples showing a GOI of not more than 8 MV at a rating current of 1 μA was 95% and the ratio of samples showing a GOI of not less than 11 MV at a rating current of 100 mA was 90%. Comparison of these test results with those of Example 1 indicates that by increasing the pulling speed during the growth of crystal, the abolition of defects could be attained to a greater depth from the surface.

When the density of defects measuring not less than 0.2 μm as reduced to diameter was determined by the infrared tomography for the purpose of examining the interior of the substrate with respect to the state of defects, it was found to be $9 \times 10^6$ pieces/cm³. The density of defects measuring not less than 0.1 μm was still greater. The fact that the density of defects at a depth of 0.1 μm from the surface of the substrate was less than $1 \times 10^3$ pieces/cm³ indicates that the density of defects was not more than 1% of that in the interior of the substrate.

Incidentally, this silicon wafer was not found to contain other kinds of defects such as staking faults in the interior of the substrate, indicating that it had high quality.

Referential Example 9

A silicon substrate manufactured from the crystal of Referential Example 6 was inserted into a furnace at 800° C., then heated at a temperature increasing rate of 10° C./min to 1100° C., retained at this temperature for 8 hours, and thereafter left cooling at a temperature decreasing rate of −10° C./min to 800° C. The substrate was extracted subsequently from the furnace. Unlike the procedure of Example 1, argon gas containing 5% of oxygen was used in the atmosphere for the heat treatment after the insertion of the sample in the furnace. When the concentration of nitrogen at the center of thickness of the heat-treated substrate was similarly determined, it was found to be about $5 \times 10^{14}$ atoms/cm³.

For the purpose of evaluating the quality of the DZ on the surface of the heat-treated substrate, the GOI of the oxide film was determined in the same manner as described above (Table 3). The ratio of samples showing a GOI of not less than 8 MV at a rating current of 1 μA was 90%, a value inferior to that obtained of samples heat treated in a non-oxidizing atmosphere stated in Example 1. The ratio of samples showing a GOI of not less than 11 MV at a rating current of 100 mA was 17%.

For the purpose of examining the effect of the heat treatment on COP's measuring not less than 0.1 μm, separate substrates were manufactured by performing the same heat treatment as mentioned above. The density of COP's on the heat-treated surface was about 6000 pieces/wafter, i.e. 40 pieces/cm³. After the substrates were washed repeatedly with an aqueous ammonia hydrogen peroxide solution till their surfaces were etched to a depth of 0.1 μm and then the density of COP's measuring not less than 0.1 μm was determined, the increase of COP's was within the range of error, indicating that the defects were abolished substantially completely. Owing to the presence of COP's at a density of 6000 pieces/wafer even prior to the repeated washing, however, the volumertric density of COP's could not be determined accurately.

Marks of crystal defects occurred on the surface of the substrate which was fresh from the heat treatment performed in an atmosphere containing oxygen, indicating the the substrate failed to secure fully satisfactory quality.

Example 3

The substrate obtained in Referential Example 9 was heat-treated and the heat-treated surface of the substrate was polished to a depth of 1 μm by mirror-surface abrasion for the purpose of removing the marks of defects on the surface. The density of COP's measuring not less than 0.1 am on the polished surface was 14 pieces/wafer, i.e. about 0.1 piece/cm³. After the washing with an aqueous ammonia hydrogen peroxide solution was similarly repeated, the volumetric density of COP's was found by testing to be $1 \times 10^3$ pieces/cm³ (Table 2). The oxide film formed on the wafer which had been polished till 1 μm in depth of etching was tested for GOI (Table 3). Consequently, the ratio of samples showing a GOI of not less than 8 MV at a rating current of 1 μA was 95% and the ratio of samples showing a GOI of not less than 11 MV at a rating current of 100 MV was 90%.

For the purpose of examining the substrate which had been polished to a depth of 1 μm after the heat treatment to determine the distribution of defects in the direction of thickness, the surface of the substrate was additionally polished to a depth of 1 μm (the total of depth of 2 μm from the surface of the substrate prior to the heat treatment). When this substrate was tested for the density of crystal defects measuring not less than 0.1 μm as reduced to diameter by the repeated washing with an aqueous ammonia hydrogen peroxide solution, this density was found to be $9 \times 10^3$ pieces/cm³. When the oxide film was tested for GOI, the ratio of samples showing a GOI of not less than 8 MV at a rating current of 1 μA was 90% and the ratio of samples showing a GOI of not less than 11 MV at a rating current of 100 mA was 85%.

For the purpose of examining the interior of the substrate with respect to the density of defects, the density of defects measuring not less than 0.2 μm as reduced to diameter at the center of thickness of the substrate was determined by the infrared tomography, it was found to be $9 \times 10^6$ pieces/cm³. The density of defects measuring not less than 0.1 μm was still greater. The density of defects at a depth of 0.1 μm from the surface of this substrate was $1 \times 10^3$ pieces/cm³, indicating that this density of defects was not more than 1% of that in the interior of the substrate.

These test results indicate that by polishing the heat-treated wafer to a depth of 1 μm and removing the COP's on the surface, the defectless layer in which the density of crystal defects measuring not less than 0.1 μm as reduced to diameter was not more than $1 \times 10^4$ pieces/cm³ was enabled to acquire a depth of not less than 1 μm in the wafer.

This silicon wafer was not found to contain other kinds of defects such as stacking faults in the interior of the substrate, indicating that the wafer had high quality.

Referential Example 10

The substrate of Example 3 was further polished to a depth of 1 μm (3 μm from the surface of the substrate prior to the heat treatment) and then tested similarly for the density of crystal defects measuring not less than 0.1 μm as reduced to diameter, this density was found to be $7 \times 10^5$ pieces/cm$^3$ (Table 2). As respects the GOI of the oxide film, the ratio of samples showing a GOI of not less than 8 Mv at a rating current of 1 μA was 75% and the ratio of samples showing a GOI of not less than 11 MV at a rating current of 100 mA was 30% (Table 3), indicating the polishing performed excessively resulted in degradation of characteristics.

Control 1

The characteristics of GOI of the oxide films of the crystals of the referential examples were evaluated in the same manner as described above. The results are shown in Table 4.

Control 2

The crystals of Referential Examples 1 and 2 were subjected to the heat treatment of Example 1 and the COP densities and the GOI of oxide film on the surface and at the depths of 1 μm and 3 μm were determined. The results are shown in Tables 5 and 6. In all the cases, the densities of crystal defects measuring not less than 0.1 μm as reduced to diameter at the depth of 1 μm invariably exceeded $1 \times 10^4$ pieces/cm$^3$. The magnitudes of the GOI of the oxide film were found to be inferior to those obtained in working examples.

Control 3

The crystal of Referential Example 8 was subjected to the heat treatment of Example 1 and the COP densities and the GOI of oxide film on the surface and at depths of 1 μm and 3 μm were determined. The results are shown in Tables 5 and 6. The COP densities measuring not less than 0.1 μm as reduced to diameter fall in the range contemplated by this invention. Though the pressure resistances of oxide film obtained herein were nearly equal to those of Example 1, the substrate manufactured herein was unsuitable for the manufacture of devices because the stacking faults, about 10 μm in diameter, occurring in the interior of the crystal protruded from the interior of the substrate to the surface, the surface density of crystal defects measuring not less than 0.1 μm as reduced to diameter on the surface of the substrate was 5 pieces/cm$^2$, and the volumetric density of crystal defects measuring not less than 0.1 μm as reduced to diameter in a region reaching a depth of 1 μm was $5 \times 10^4$ pieces/cm$^3$.

Example 4

The crystals of Referential Examples 3 and 4 were subjected to the heat treatment of Example 1 and the COP densities and the pressure resistances of oxide film on the surface and at depths of 1 μm and 3 μm were determined. The results are shown in Tables 7 and 8. The heat-treated substrates were cleaved and the sections were examined to determine nitrogen concentrations at the center of thickness of substrate by the SIMS. The crystals of Referential Examples 3 and 4 invariably defied determination of nitrogen concentration. The signal of nitrogen, however, was found to be locally increased by an intensity of not less than twice the background signal intensity.

TABLE 1

Number of COP's measuring not less than 0.1 μm (pieces/6-inch wafer)

| Crystal | 1) | 2) | 3) | 4) | 5) | 6) | 7) | 8) |
|---|---|---|---|---|---|---|---|---|
| A | 2000 | 2000 | 2000 | 1000 | 0 | 0 | 0 | 0 |
| B | 4000 | 4000 | 4000 | 5000 | 6000 | 8000 | 6000 | 6000 |

A represents the number of COP's prior to the washing with an aqueous ammonia hydrogen peroxide solution
B represents the number of COP.s after the surface was etched on one side to a depth of 0.1 μm by repeated washing with an aqueous ammonia hydrogen peroxide solution

TABLE 2

Densities of COP's measuring not less than 0.1 μm after heat treatments in Examples 1, 2, and 3 (pieces/cm$^3$)

| Crystal | Example 1 5) | Example 1 15 7) | Example 2 6) | Example 3 6) |
|---|---|---|---|---|
| Surface | <1E+03 | <1E+03 | <1E+03 | — |
| Polished to a depth of 1 μm | 3E+03 | 3E+03 | <1E+03 | 1E+03 |
| Polished to a depth of 3 μm | 3E+04 | 3E+04 | 3E+03 | 7E+05* |

*(7E+05) is the numerical value of Referential Example 10.

TABLE 3

Pressure resistances of oxide film of Examples 1, 2, and 3 (in %)

| Crystal | Rating current | Example 1 5) | Example 1 7) | Example 2 6) | Example 3 6) |
|---|---|---|---|---|---|
| Surface | 1 μA | 99 | 99 | 99 | 90* |
|  | 100 mA | 95 | 95 | 95 | 17* |
| Polished to a depth of 1 μm | 1 μA | 95 | 99 | 99 | 95 |
|  | 100 mA | 92 | 92 | 95 | 90 |
| Polished to a depth of 3 μm | 1 μA | 90 | 95 | 95 | 75** |
|  | 100 mA | 80 | 85 | 90 | 30** |

*Numerical value of Referential Example 9
**Numerical value of Referential Example 10

TABLE 4

GOI of oxide film of the crystals of Referential Examples 1–8 (in %)

| Crystal | 1) | 2) | 3) | 4) | 5) | 6) | 7) | 8) |
|---|---|---|---|---|---|---|---|---|
| A | 23 | 23 | 20 | 10 | 0 | 0 | 0 | 0 |
| B | 8 | 8 | 0 | 0 | 0 | 0 | 0 | 0 |

TABLE 5

COP densities of not less than 0.1 μm in Controls 2 and 3 (pieces/cm$^3$)

| Crystal | Control 2 1) | Control 2 2) | Control 3 8) |
|---|---|---|---|
| Surface | <1E+03 | <1E+03 | <1E+03 |
| Polished to a depth of 1 μm | 3E+05 | 3E+05 | 5E+03 |
| Polished to a depth of 3 μm | 3E+05 | 3E+05 | 5E+04 |

TABLE 6

GOI of oxide film after heat treatment in Controls 2 and 3 (in %)

| Crystal | Rating current | Control 2 1) | Control 2 2) | Control 3 5) |
|---|---|---|---|---|
| Surface | 1 μA | 95 | 99 | 99 |
|  | 100 mA | 92 | 95 | 95 |
| Polished to a depth of 1 μm | 1 μA | 75 | 75 | 90 |
|  | 100 mA | 17 | 17 | 80 |
| Polished to a depth of 3 μm | 1 μA | 32 | 32 | 90 |
|  | 100 mA | 13 | 13 | 80 |

TABLE 7

COP densities of not less than 0.1 μm in Example 4 (pieces/cm$^3$)

| Crystal | Example 4 3) | Example 4 4) |
|---|---|---|
| Surface | <1E+03 | <1E+03 |
| Polished to a depth of 1 μm | 1E+04 | 5E+03 |
| Polished to a depth of 3 μm | 5E+04 | 3E+04 |

TABLE 8

GOI of oxide film after heat treatment in Example 4 (in %)

| Crystal | Rating current | Example 4 3) | Example 4 4) |
|---|---|---|---|
| Surface | 1 μA | 95 | 99 |
|  | 100 mA | 92 | 95 |
| Polished to a depth of 1 μm | 1 μA | 90 | 92 |
|  | 100 mA | 85 | 90 |
| Polished to a depth of 3 μm | 1 μA | 70 | 90 |
|  | 100 mA | 60 | 80 |

Examples 5–48
Controls 4–10

For a start, the manner of pulling a crystal and the common method of production in these working examples and the controls will be described. The diameter of crystal was for the 8-inch grade (205 mm in diameter), the conduction type was P type (boron doped), and the resistivity was 10 Ωcm. Besides these crystals, other crystals having a crystal diameter for the 8-inch grade (205 mm in diameter), a conduction type of P type (boron dope), and resistivity of 0.02 Ωcm were prepared. The samples were manufactured in three kinds of oxygen concentration, i.e. those of a low oxygen region of 2.0–5.0×10$^{17}$ atoms/cm$^3$, those of a medium oxygen region of 7.0–8.0×10$^{17}$ atoms/cm$^3$, and those of a high oxygen region of 9.0–10.0×10$^{17}$ atoms/cm$^3$ (the oxygen concentrations were determined by the infrared absorption method and the concentrations were calculated by using the oxygen concentration conversion factor established by Japan Electronic Industry Development Association (JEIDA)), by adjusting the conditions for application of magnetic field, the rotational speed of crucible, etc. The carbon concentrations in all the crystals were invariably less than 1.0×10$^{16}$ atoms/cm$^3$ (determined by the infrared absorption method, with the concentrations calculated by using the carbon concentration conversion factor established by Japan Electronic Industry Development Association (JEIDA)). These crystals were invariably manufactured by preparing a raw material, about 80 kg in weight, in a molten state and pulling a single crystal ingot, 205 mm in diameter and about 60 kg in weight), from the melt. The addition of nitrogen was effected by preparing a wafer having a nitride film formed on a non-dope silicon substrate by the CVD (chemical vapor deposition) method and melting this wafer as the same time that the raw material was dissolved. The nitrogen concentration in the molten silicon was controlled by calculating the amount of nitrogen per nitride film-deposited wafer from the thickness of the nitride film on the wafer melted at the same time that the raw material was dissolved and limiting the number of nitride film-deposited wafers to be added relative to the target nitrogen concentration. The nitrogen concentration in the silicon single crystal was determined by the SIMS, providing that the concentration falling short of the lower limit of detection of the SIMS, i.e. 1.0×10$^{14}$ atoms/cm$^3$, was calculated from the equilibrium segregation factor. Incidentally, when the nitrogen concentration in the crystal was not more than 1.0×10$^{14}$ atoms/cm$^3$, the nitrogen concentration in the wafer could not be determined by the SIMS as described above. In the case of a nitrogen concentration of not less than 1.0×10$^{13}$ atoms/cm$^3$, the nitrogen signal was found by the SIMS to be locally increased by an intensity of not less than twice the background level.

The manufacture of a silicon semiconductor substrate was effected by cutting a segment of a given crystal gown by pulling, grinding the segment into a cylinder, fabricating the cylinder through the steps of slicing, mirror-surface polishing, and washing for cleaning into a wafer, using this wafer as a substrate wafer, setting this substrate wafer in an epitaxial growing device, heating this substrate wafer to a temperature of 1100° C.–1150° C., then etching the hot substrate wafer with hydrogen chloride gas for several minutes, and growing an epitaxial single crystal layer, 5 μm in thickness, on the surface of the wafer at 1150° C. by using trichlorosilane gas.

The silicon semiconductor substrate obtained by this invention was evaluated by polishing the surface of the substrate to a depth of 5 μm, stripping the silicon substrate of an epitaxial layer, washing the surface of the remaining silicon substrate with an SC-1 detergent composed of ammonia:hydrogen peroxide:water=1:1:5, and determining the number of COP defects, exceeding 0.1 μm in size, detectable with a laser particle counter LS6000. The volumetric density of COP defects or void defects was calculated by performing the cleaning with SC-1 and the determination of particles up to ten repititions and finding the increment. Then, the evaluation in the direction of depth was effected by depriving a given silicon semiconductor substrate of an epitaxial layer by polishing thereby preparing a silicon substrate and determining the density of the defects measuring not less than 0.1 μm as reduced to diameter and existing at a depth of 1 μm with a defect measuring device, i.e. an optical precipitate profiler (OPP), based on the principle of the infrared laser interference method. The density of the defects measuring not less than 0.1 μm and detectable with the OPP had a relation of 1:1 with the density of COP defects obtained by the method of particle determination. Concerning the minute defects measuring not less than 20 nm as reduced to diameter, the density of minute defects existing at a depth of 1 μm below the epitaxial layer or the interface between the epitaxial layer and the substrate wafer and the density of crystal defects existing in the interior (center of thickness) of the substrate wafer and serving as an index of the ability of the IG effect were examined with a defect measuring device (infrared laser tomograph) based on the infrared laser scattering method.

The density of the minute defects existing at a density of not less than $1\times10^{10}$ pieces/cm$^3$ were measured by the use of a transmission electron microscope.

Figure 7:
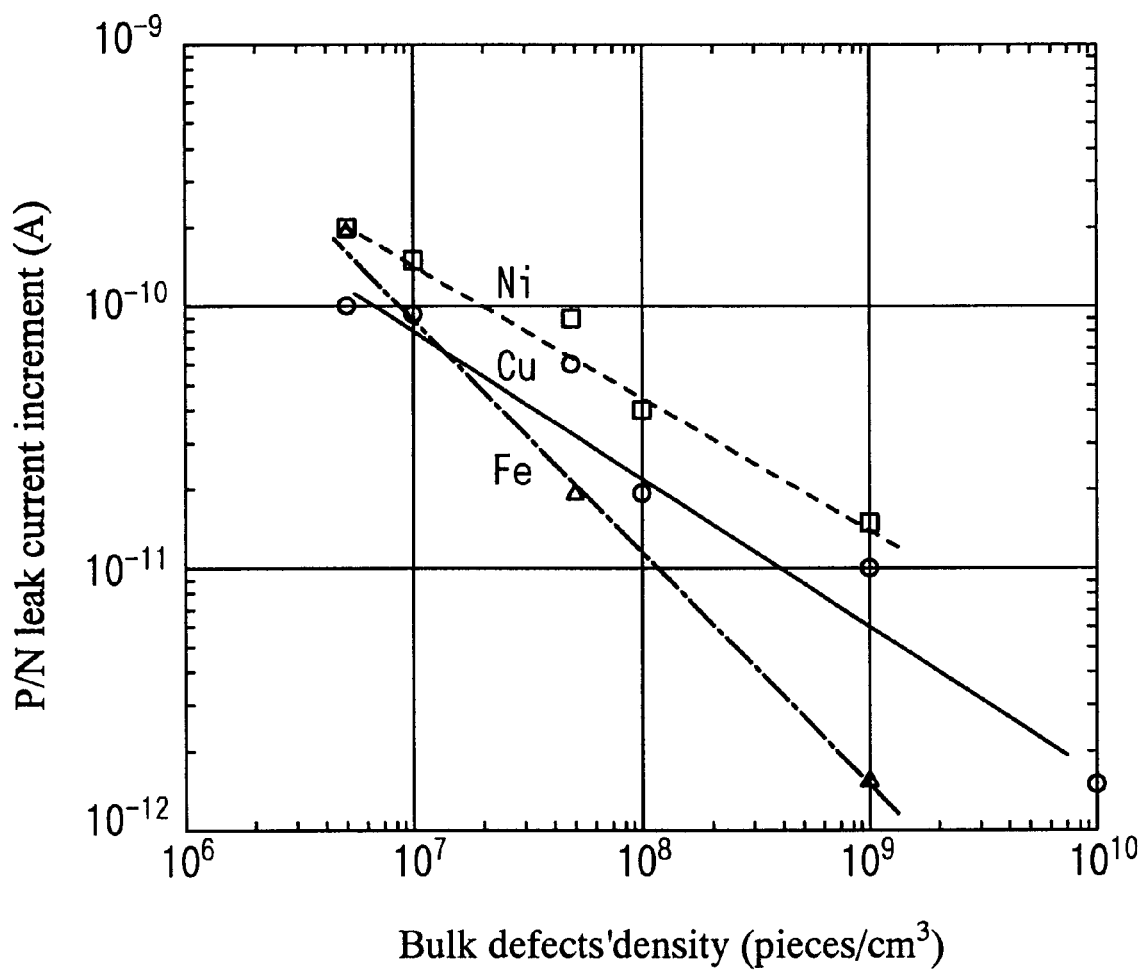
FIG. 7 is a graph showing the relation between the amount of increase of P/N leak current and the density of bulk defects obtained on an epitaxial silicon wafer after the surface of this wafer was intentionally polluted to a degree of $10^{12}$ atoms/cm$^2$ with such metallic impurities as copper, nickel, and iron and further subjected to a CMOS heat treatment.

Further, the silicon semiconductor substrate subsequent to the epitaxial growth, as one pattern of heat treatment for the manufacture of devices, was heat-treated in an atmosphere of nitrogen at 800° C., then heat-treated in an atmosphere of oxygen at 1000° C. for 16 hours, and thereafter subjected to the infrared laser tomography, detection of defects, and light etching with a selective etchant to a depth of 3 μm to determine the presence or absence of the formation of crystal defects in the epitaxial layer. The density of bulk defects was adopted as the index for the gettering ability. This choice was based on the results of an experiment which comprised intentionally polluting the surface of an epitaxial silicon semiconductor substrate with metallic impurities of copper, nickel, and iron to a degree of $10^{12}$ atoms/cm$^2$, then subjecting the polluted substrate to the CMOS heat treatment which is the standard heat treatment for the process of device manufacture, subsequently forming a P/N junction element, 30 mm$^2$ in area, on the substrate, and determining the amount of change of the P/N leak current due to the presence or absence of intentional pollution. The results of a typical evaluation are shown in FIG. 7. It is clearly noted from the data that the amount of increase of the P/N leak current after the intentional pollution decreased in proportion as the density of bulk interior defects increased, indicating that the gettering ability was high.

Tables 9 (a) and (b)–Tables 20 (a) and (b) summarize the characteristics of production conditions, the results of the evaluation of defects, and the results of the evaluation of life time obtained of the working examples of this invention and Tables 21 (a) and (b)–Tables 22 (a) and (b) those obtained of the controls.

Examples 5–10

Figure 3:
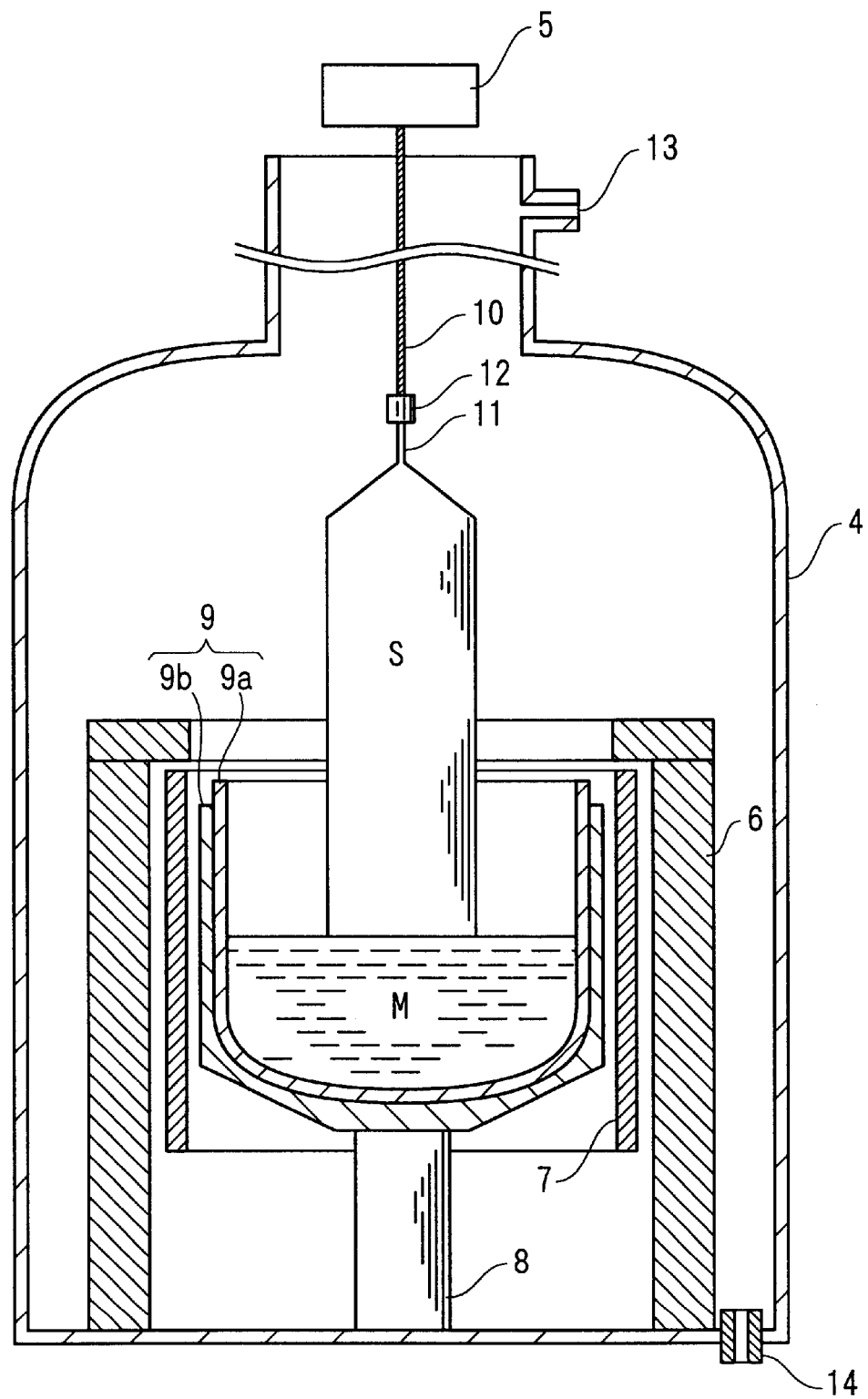
FIG. 3 is a schematic diagram illustrating an ordinary CZ single crystal pulling apparatus not particularly provided as with a crystal cooling device. Although this diagram does not particularly show any device for the application of a magnetic field, the apparatus may be provided in the periphery of the main body of a pulling furnace with the device for the application of a magnetic field and enabled to perform a pulling work in a magnetic field applied thereto.

In Examples 5–10, the crystals were grown by pulling by using such a CZ single crystal growing device as illustrated in FIG. 3 under such production conditions as shown in Table 9 (a) and Table 10 (a). The data of Table 9 (a) concern crystals having resistivity of 10 Ωcm and those of Table 10 (a) concern crystals having resistivity of 0.02 Ωcm. The nitrogen concentrations were on the two levels, i.e. low concentration and high concentration and the oxygen concentrations were on the three levels, i.e. low, medium, and high concentration.

This CZ method single crystal growing device was an ordinary device not provided with such devices as a crystal cooling device. It was composed of a crucible 9 comprising a quartz crucible 9a for holding molten silicon M and a graphite crucible 9b for protecting the quartz crucible 9a and a silicon single crystal pulling furnace 4 for holding a silicon crystal A being pulled. On the lateral part of the crucible 9, a heater 7 and a heat insulating member 6 intended to prevent the heat of the heater 7 from leaking to the exterior of the crystal pulling furnace were disposed so as to encircle the crucible 9. The crucible 9 was connected to a drive device not shown in the diagram through the medium of a rotary jig 8 and, at the same time, reciprocated vertically so as to compensate for the fall of the level of the molten silicon resulting from the decrease of the molten silicon in the crucible 9. Inside the pulling furnace 4, a pulling wire 10 was disposed in a suspended state. This wire was provided at the lower end thereof with a chuck 12 for taking hold of a seed crystal 10. This pulling wire 10 had the upper terminal side thereof wound on a wire hoisting machine 5 and was provided with a pulling device adapted to pull a silicon single crystal ingot. Such a gas as argon gas was introduced into the pulling furnace 4 through a gas inlet 13 formed in the pulling furnace 4 and, and after flowing through the interior of the pulling furnace 4, was discharged through a gas outlet 14. This flow of the gas was intended to discharge promptly out of the furnace such gases as SiO and CO as occurring inside the pulling furnace 4 and forming a cause for inhibiting the growth of silicon single crystal. Though the diagram does not particularly illustrate any device for application of magnetic field, a device for application of a magnetic field may be disposed, as occasion demands, in the periphery of the pulling furnace so as to allow the work of pulling to proceed in a magnetic field applied thereto.

Example 5 produced a crystal of low oxygen at a low nitrogen level, Example 6 a crystal of medium oxygen at a low nitrogen level, Example 7 a crystal of high oxygen at a low nitrogen level, Example 8 a crystal of low oxygen at a high nitrogen level, Example 9 a crystal of medium oxygen at a high nitrogen level, and Example 10 a crystal of high oxygen at a high nitrogen level. The cooling speeds of crystal through the range of the solidification point (Tm) –800° C. fell in the range of 2.4° C./minute to 0.8° C./minute. All of them were not more than 2.0° C./minute through the temperature range mentioned above. The cooling speeds in the range of temperature from 800° C. to 400° C. fell in the range of 1.2° C./minute to 0.5° C./minute. All of them were not more than 1.0° C./minute. These crystals were manufactured into silicon semiconductor substrates by fabricating them into wafers and then, with the wafers used as substrate wafers, epitaxially growing a single crystal layer on the surface thereof ina thickness of 5 μm. The results of the evaluation of the crystals are shown in Table 9 (b) and Table 10 (b). In all the crystals, the density of defects (void defects) measuring not less than 0.1 μm as reduced to diameter in a region reaching a depth of 1 μm from the interface between the epitaxial layer and the substrate silicon wafer prior to the deposition of the epitaxial layer was not more than $1.0\times10^3$ pieces/cm$^3$, a value representing a conspicuous decrease. Likewise, the density of minute defects measuring not less than 20 nm as reduced to diameter was on the level of $10^5$ pieces/cm$^3$, a value representing a decrease as compared with the conventional density. In contrast, in any of the crystals, the density of minute defects measuring not less than 20 nm in a region at the center of thickness of the substrate wafer (bulk region) was not less than $1.0\times10^9$ pieces/cm$^3$, a value representing a conspicuous increase in the defects useful for the IG effect. Absolutely no crystal defect occurred in the epitaxial layer after the evaluation of heat treatment, the defectless layer extending from the epitaxial layer through the lower surface of the substrate silicon wafer (namely the interface between the epitaxial layer and the substrate wafer) was wide, and the protrusion of minute defects such as oxygen precipitates into the epitaxial layer was absent. A concept of the sectional structure of the silicon semiconductor substrate produced in the present example is illustrated in FIG. 1.

Examples 11–13

Figure 4:
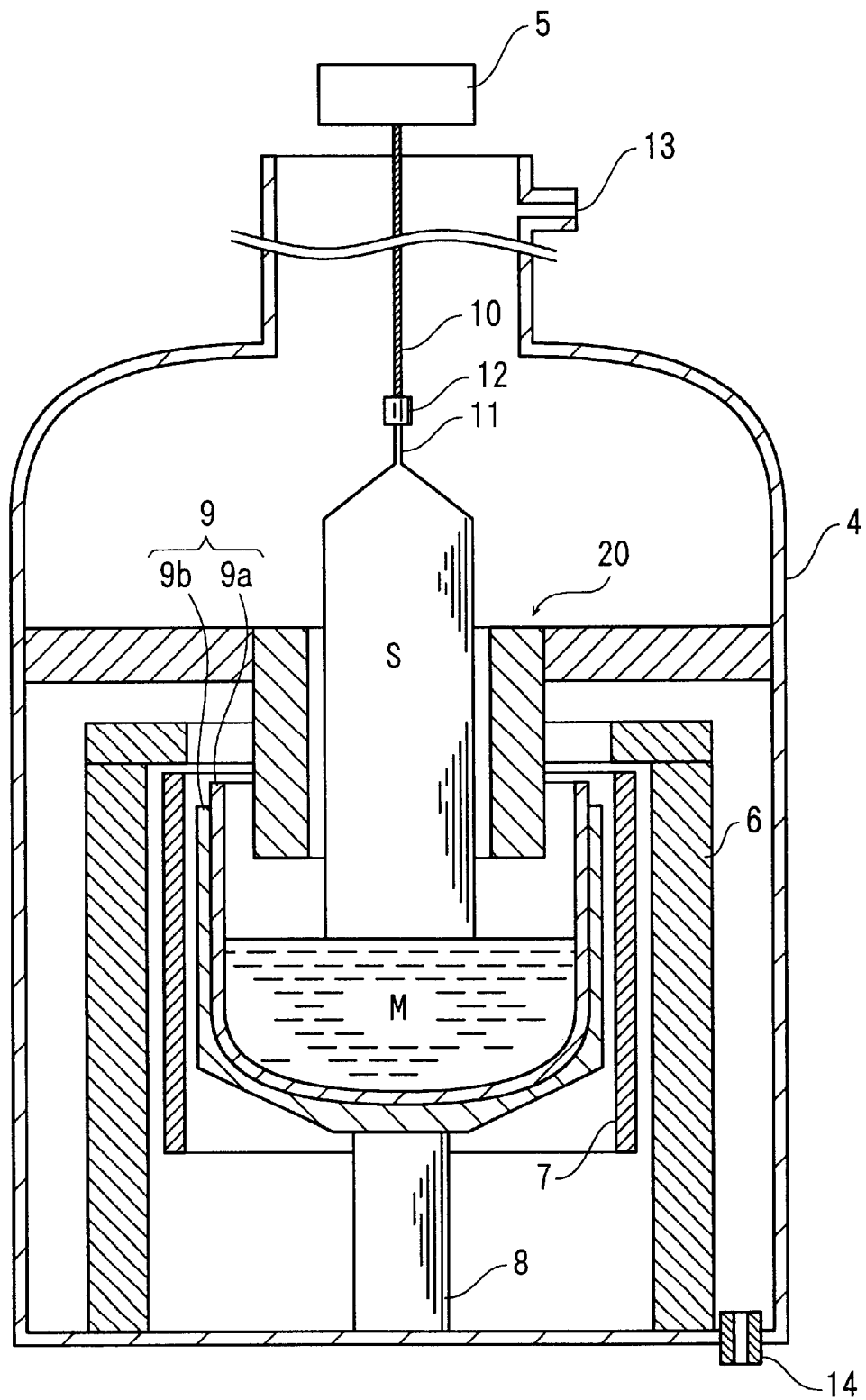
FIG. 4 is a schematic diagram illustrating an apparatus for the production of a CZ silicon single crystal which is provided with a crystal cooling device 20 so as to effect quenching at a speed of not less than 2.0° C./minute through the entire range of crystal temperature from the solidifying point to 800° C. Though this diagram does not particularly show any device for the application of a magnetic field, the apparatus may be provided in the periphery of the main body of a pulling furnace with the device for the application of a magnetic field and enabled to perform a pulling work in a magnetic field applied thereto.

Concerning Examples 11–13, the production condition for the growth by pulling and the results of the evaluation are shown in Tables 11 (a) and (b) and Tables 12 (a) and (b). To be specific, Tables 11 (a) and (b) concern the data of crystals having resistivity of 10 Ωcm and Tables 12 (a) and (b) concern those of crystals having resistivity of 0.02 Ωcm. Example 11 produced a crystal of low oxygen, Example 12 a crystal of medium oxygen, and Example 13 a crystal of high oxygen. These crystals were grown by pulling by using a CZ single crystal growing device having disposed inside the pulling furnace such a crystal cooling device 20 as illustrated in FIG. 4. The diagram does not particularly illustrate a device for applying a magnetic field. Optionally, a device for the application of a magnetic field may be disposed in the periphery of the furnace to allow the work of pulling to proceed in a magnetic field applied thereto. The crystal cooling speeds through the range of temperature of the solidification point (Tm)–800° C. invariably fell in the range of 6.0° C./minute to 2.0° C./minute. Through the whole range of solidification points from Tm to 800° C., the cooling speeds invariably exceeded 2.0° C./minute. Through the range of temperature from 800° C. to 400° C., the cooling speeds fell in the range of 2.0° C./minute–0.5° C./minute. All the cooling speed did not exceed 1.0° C./minute. The silicon single crystals grown herein were manufactured into silicon semiconductor substrates by fabricating them into wafers and then, with the wafers used as substrate wafers, epitaxially growing a single crystal layer on the surface of a given substrate wafer in a thickness of 5 μm. In any of the crystals, the density of defects (void defects) measuring not less than 0.1 μm as reduced to diameter was $1.0 \times 10^4$ pieces/cm$^3$, representing a decrease. Likewise, the density of minute defects measuring not less than 20 nm as reduced to diameter was on the level of $10^5$ pieces/cm$^3$, representing a decrease as compared with the conventional density. In contrast, in any of the crystals, the density of minute defects measuring not less than 20 nm in a region at the center of thickness of the substrate wafer (bulk region) was not less than $1.0 \times 10^8$ pieces/cm$^3$, indicating a conspicuous increase in the defects useful for the IG effect. Absolutely no crystal defect occurred in the epitaxial layer after the evaluation of heat treatment, the defectless layer extending from the epitaxial layer through the lower surface of the substrate silicon wafer (namely the interface between the epitaxial layer and the substrate wafer) was formed fully satisfactorily, and the protrusion of minute defects such as oxygen precipitates into the epitaxial layer was absent. A concept of the sectional structure of the silicon semiconductor substrate produced in the present example is illustrated in FIG. 2.

Examples 14–16

Figure 5:
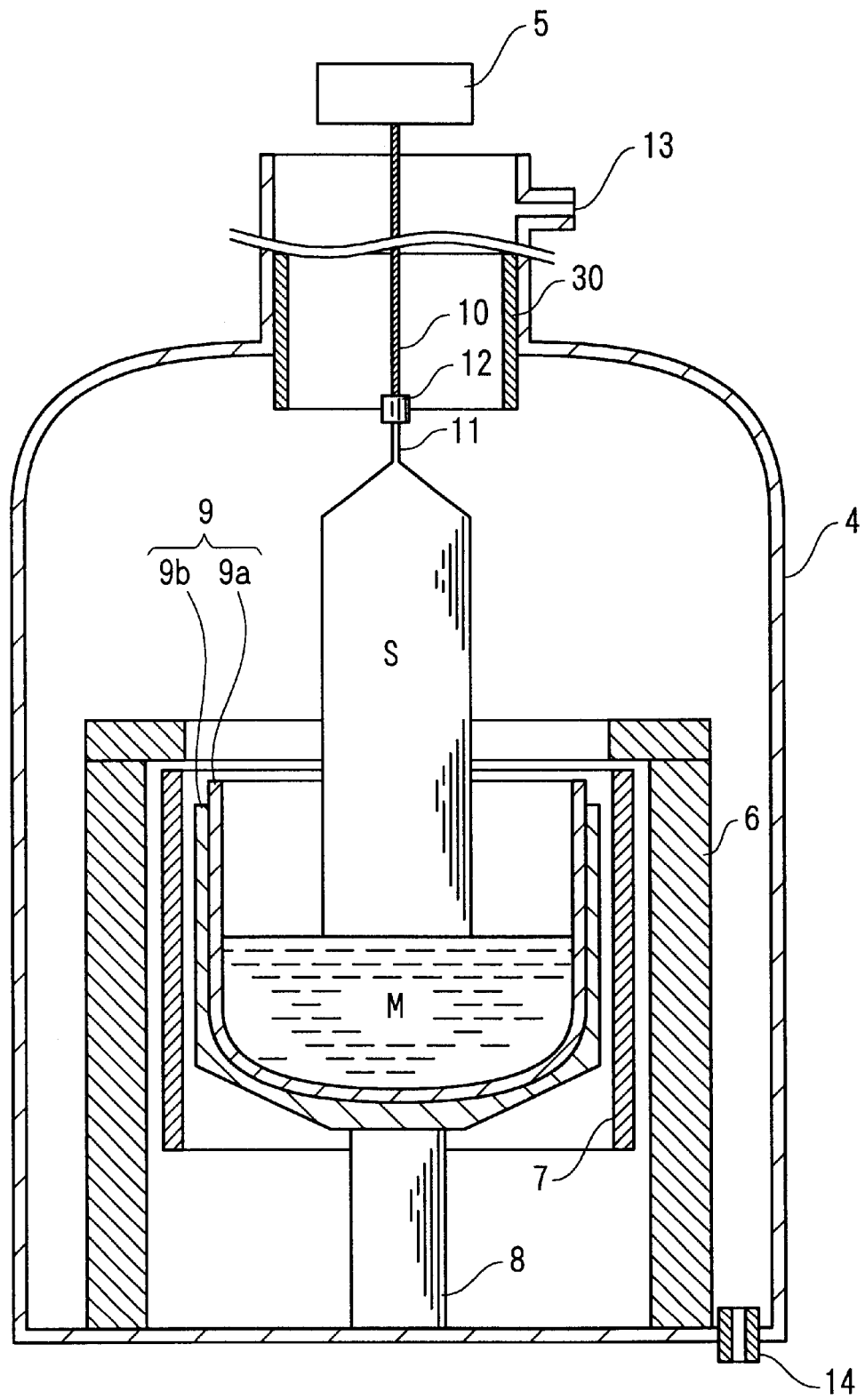
FIG. 5 is a schematic diagram illustrating an apparatus for the production of a CZ silicon single crystal which is provided with a crystal cooling device 30 so as to effect quenching at a speed of not less than 1.0° C./minute through the entire range of crystal temperature from 800° C. to 400° C. Though this diagram does not particularly show any device for the application of a magnetic field, the apparatus may be provided in the periphery of the main body of a pulling furnace with the device for the application of a magnetic field and enabled to perform a pulling work in a magnetic field applied thereto.

Concerning Examples 14–16, the production condition for the growth by pulling and the results of the evaluation are shown in Tables 13 (a) and (b) and Tables 14 (a) and (b). To be specific, Tables 13 (a) and (b) concern the data of crystals having resistivity of 10 Ωcm and Tables 14 (a) and (b) concern those of crystals having resistivity of 0.02 Ωcm. Example 14 produced a crystal of low oxygen, Example 15 a crystal of medium oxygen, and Example 16 a crystal of high oxygen. These crystals were grown by pulling by using a CZ single crystal growing device having disposed inside the pulling furnace such a crystal cooling device 30 as illustrated in FIG. 5. The crystal cooling speeds through the range of temperature of the solidification point (Tm)–800° C. invariably fell in the range of 2.4° C./minute to 1.5° C./minute. Through the range of temperature mentioned above, all the cooling speeds did not exceed 2.0° C./minute. Through the range of temperature from 800° C. to 400° C., the cooling speds fell in the range of 1.6° C./minute–1.2° C./minute. Through the whole range of temperature mentioned above, all the cooling speeds exceeded 1.0° C./minute. The silicon single crystals grown herein were manufactured into silicon semiconductor substrates by fabricating them into wafers and then, with the wafers used as substrate wafers, epitaxially growing a single crystal layer on the surface of a given substrate wafer in a thickness of 5 μm. In any of the crystals, the density of defects (void defects) measuring not less than 0.1 m as reduced to diameter was $1.0 \times 10^4$ pieces/cm$^3$, representing a decrease. Likewise, the density of minute defects measuring not less than 20 nm as reduced to diameter was on the level of $10^5$ pieces/cm$^3$, representing a decrease as compared with the conventional density. Absolutely no crystal defect occurred in the epitaxial layer after the evaluation of heat treatment, the defectless layer extending from the epitaxial layer through the lower surface of the substrate silicon wafer (namely the interface between the epitaxial layer and the substrate wafer) was formed fully satisfactorily, and the protrusion of minute defects such as oxygen precipitates into the epitaxial layer was absent.

Examples 17–19

Figure 6:
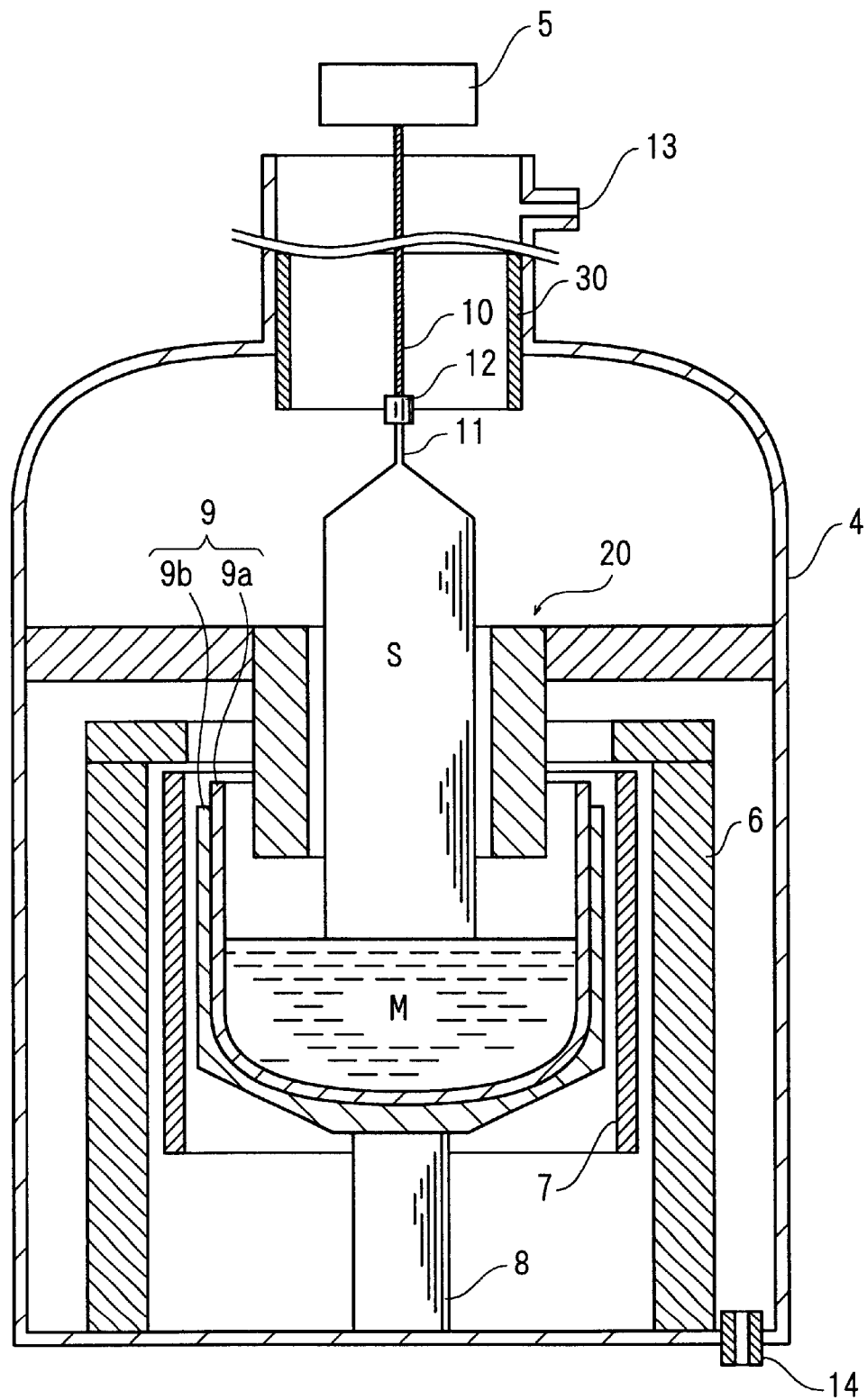
FIG. 6 is a schematic diagram illustrating an apparatus for the production of a CZ silicon single crystal which is provided in the apparatus of FIG. 4 with a crystal cooling device 30 so as to effect quenching at a speed of not less than 1.0° C./minute through the entire range of crystal temperature from 800° C. to 400° C. Though this diagram does not particularly show any device for the application of a magnetic field, the apparatus may be provided in the periphery of the main body of a pulling furnace with the device for the application of a magnetic field and enabled to perform a pulling work in a magnetic field applied thereto.

Concerning Examples 17–19, the production condition for the growth by pulling and the results of the evaluation are shown in Tables 15 (a) and (b) and Tables 16 (a) and (b). To be specific, Tables 15 (a) and (b) concern the data of crystals having resistivity of 10 Ωcm and Tables 16 (a) and (b) concern those of crystals having resistivity of 0.02 Ωcm. Example 17 produced a crystal of low oxygen, Example 18 a crystal of medium oxygen, and Example 19 a crystal of high oxygen. These crystals were grown by pulling by using a CZ single crystal growing device having disposed inside the pulling furnace such crystal cooling devices 20 and 30 as illustrated in FIG. 6. The crystal cooling speeds through the range of temperature from the solidification point (Tm) –800° C. invariably fell in the range of 6.5° C./minute to 2.0° C./minute. Further through the range of temperature from 800° C. to 400° C., the cooling speeds fell in the range of 2.0° C./minute–1.2° C./minute. Through the whole range of temperature from Tm to 800° C., all the cooling speeds exceeded 2.0° C./minute. Then, through the whole range of temperature from 800° C. to 400° C., the cooling speeds exceeded 1.0° C./minute. The silicon single crystals grown herein were manufactured into silicon semiconductor substrates by fabricating them into wafers and then, with the wafers used as substrate wafers, epitaxially growing a single crystal layer on the surface of a given substrate wafer in a thickness of 5 μm. Owing to the consequence that the quenching occurred throughout the entire wide range of temperature from the solidification point to 400° C., the void defects measuring not less than 0.1 μm and the minute defects measuring not less than 20 nm were both decreased conspicuously. The density of defects measuring not less than 0.1 μm as reduced to diameter (void defects) was decreased to below $1.0 \times 10^4$ pieces/cm$^3$ in the region reaching a depth of 1 μm from the interface between the epitaxial layer and the substrate silicon wafer and the density of minute defects measuring not less than 20 nm as reduced to diameter likewise showed a conspicuous decrease to below $5.0 \times 10^4$ pieces/cm$^3$. In any of the crystals, the density of minute defects measuring not less than 20 nm was not less than $1.0 \times 10^8$ pieces/cm$^3$ in the region at the center of thickness of the substrate wafer (bulk region), representing a conspicuous increase of the defects useful for the IG effect. Absolutely no crystal defect occurred in the epitaxial layer after the evaluation of heat treatment, the defectless layer extending from the epitaxial layer through the lower surface of the substrate silicon wafer (namely the interface between the epitaxial layer and the substrate wafer) was formed fully satisfactorily, and the protrusion of minute defects such as oxygen precipitates into the epitaxial layer was absent.

Examples 20–25

Concerning Examples 20–25, the production conditions for the growth by pulling and the results of the evaluation are shown in Tables 17 (a) and (b) and Tables 18 (a) and (b). To be specific, Tables 17 (a) and (b) concern the data of crystals having resistivity of 10 Ωcm and Tables 18 (a) and (b) concern those of crystals having resistivity of 0.02 Ωcm. In the present examples, similarly in Examples 15–17, crystals containing added nitrogen were grown by pulling with such a CZ single crystal growing device as illustrated in FIG. 4. The crystal cooling speeds through the range of temperature of the solidification point (Tm)–800° C. fell in the range of 6.0° C./minute to 2.0° C./minute and through the range of crystal temperature from Tm to 800° C. exceeded 2.0° C./minute. Through the range of crystalline temperature from 800° C. to 400° C., the cooling speeds fell in the range of 2.0° C./minute–0.5° C./minute. All the cooling speeds did not exceed 1.0° C./minute throughout the entire range of crystallization temperature of 2.0° C./minute–0.5° C./minute. The silicon single crystals consequently grown were manufactured into silicon semiconductor substrate by fabricating them into wafers and then, with the wafers used as substrate wafers, epitaxially growing a single crystal layer on the surface of a given substrate wafer in a thickness of 5 μm. The nitrogen concentrations and the oxygen concentrations in the crystals were similar to those mentioned in Examples 5–10. Example 20 produced a crystal of low oxygen at a low nitrogen level, Example 21 a crystal of medium oxygen at a low nitrogen level, Example 22 a crystal of high oxygen at a low nitrogen level, Example 23 a crystal of low oxygen at a high nitrogen level, Example 24 a crystal of medium oxygen at a high nitrogen level, and Example 25 a crystal of high oxygen at a high nitrogen level. In any of the crystals, the density of defects (void defects) measuring not less than 0.1 μm as reduced to diameter in the region of the interface between the epitaxial layer and the substrate wafer was not more than $1.0 \times 10^2$ pieces/cm$^3$, practically representing a zero level and, even in the region reaching a depth of 1 μm from the interface, was not more than $1.0 \times 10^3$ pieces/cm$^3$, representing a conspicuous decrease. The densities of minute defects measuring not less than 20 nm as reduced to diameter, in the interface and in the region reaching a depth of 1 μm from the interface, were not more than $10^4$ pieces/cm$^3$, representing a conspicuous decrease. In any of the crystals, the density of minute defects of not less than 20 nm in the region at the center of thickness of the substrate wafer was in the neighborhood of $1.0 \times 10^{10}$ pieces/cm$^3$, representing a conspicuous increase of defects useful for the IG effect. Absolutely no crystal defect occurred in the epitaxial layer after the evaluation of heat treatment, the defectless layer extending from the epitaxial layer through the lower surface of the substrate silicon wafer (namely the interface between the epitaxial layer and the substrate wafer) was wide, and the protrusion of minute defects such as oxygen precipitates into the epitaxial layer was absent.

Examples 26–31

Concerning Examples 26–31, the production conditions for the growth by pulling and the results of the evaluation are shown in Tables 17 (a) and (b) and Tables 18 (a) and (b). To be specific, Tables 17 (a) and (b) concern the data of crystals having resistivity of 10 Ωcm and Tables 18 (a) and (b) concern those of crystals having resistivity of 0.02 Ωcm. In the present examples, similarly in Examples 14–16, crystals containing added nitrogen were pulled to grow by using such a CZ single crystal growing device as illustrated in FIG. 5. The crystal cooling speeds through the range of temperature from the solidifying point (Tm)–800° C. fell in the range of 2.4° C./minute to 1.5° C./minute. All the cooling speeds were not less than 2.0° C. throughout the entire range of temperature mentioned above. The cooling speeds through the range of temperature from 800° C. to 400° C. fell in the range of 1.6° C./minute to 1.2° C. All the cooling speeds were not less than 1.0° C./minute throughout the entire range of temperature mentioned above. The silicon single crystals consequently grown were manufactured into silicon semiconductor substrates by fabricating them into wafers and then, with the wafers used as substrate wafers, epitaxially growing a single crystal layer on the surface of a given substrate wafer in a thickness of 5 μm. The nitrogen concentrations and the oxygen concentrations in the crystals were similar to those mentioned in Examples 5–10. Example 26 produced a crystal of low oxygen at a low nitrogen level, Example 27 a crystal of medium oxygen at a low nitrogen level, Example 28 a crystal of high oxygen at a low nitrogen level, Example 29 a crystal of low oxygen at a high nitrogen level, Example 30 a crystal of medium oxygen at a high nitrogen level, and Example 31 a crystal of high oxygen at a high nitrogen level. In the region reaching a depth of 1 μm from the interface between the epitaxial layer and substrate silicon wafer, the densities of defects measuring not less than 0.1 g m as reduced to diameter were not less than $1.0 \times 10^3$ pieces/cm$^3$, representing a conspicuous decrease. The densities of minute defects measuring not less than 20 nm as reduced to diameter in the interface and in the region reaching a depth of 1 μm from the interface as well were not more than $10^4$ pieces/cm$^3$, representing a conspicuous decrease. In any of the crystals, minute defects of not less than 20 nm were present in the region at the center of thickness of the substrate wafer (bulk region) at an approximate density of $1.0 \times 10^3$ pieces/cm$^3$, representing a conspicuous increase useful for the IG effect. Absolutely no crystal occurred in the epitaxial layer after the evaluation of heat treatment, the defectless layer extending from the epitaxial layer through the lower surface of the substrate silicon wafer (namely the interface between the epitaxial layer and the substrate wafer) was wide, and the protrusion of minute defects such as oxygen precipitates into the epitaxial layer was absent.

Examples 32–37

Concerning Examples 32–37, the production conditions for the growth by pulling and the results of the evaluation are shown in Tables 17 (a) and (b) and Tables 18 (a) and (b). Incidentally,. Tables 17 (a) and (b) concern the data of crystals having resistivity of 10 Ωcm and Tables 18 (a) and (b) concern those of crystals having resistivity of 0.02 Ωcm. In the present examples, similarly in Examples 17–19, crystals containing added nitrogen were grown by pulling with such a CZ single crystal growing device as illustrated in FIG. 6. The crystal cooling speeds through the range of temperature from the solidifying point (Tm)–800° C. fell in the range of 6.5° C./minute to 2.0° C./minute. Further, those through the range of from 800° C. to 400° C. fell in the range of from 2.0° C./minute to 1.2° C./minute. Through the entire range of crystal temperature from Tm to 800° C., the cooling speeds were not less than 2.0° C./minute. Further, through the entire range of crystallization temperature from 800° C. to 400° C., the cooling speeds were not less than 1.0° C./minute. The silicon single crystals consequently grown were manufactured into silicon semiconductor substrates by fabricating them into wafers and then, with the wafers used as substrate wafers, epitaxially growing a single crystal layer on the surface of a given substrate wafer in a thickness of 5 μm. The nitrogen concentrations and the oxygen concentrations in the crystals were similar to those mentioned in Examples 5–10. Example 32 produced a crystal of low oxygen at a low nitrogen level, Example 33 a crystal of medium oxygen at a low nitrogen level, Example 34 a crystal of high oxygen at a low nitrogen level, Example 35 a crystal of low oxygen at a high nitrogen level, Example 36 a crystal of medium oxygen at a high nitrogen level, and Example 37 a crystal of high oxygen at a high nitrogen level. In any of the crystals, the density of defects measuring not less than 0.1 μm as reduced to diameter (void defects) was not more than $1.0 \times 10^2$ pieces/cm$^3$, representing practically a zero level, in the region of the interface between the epitaxial layer and the substrate silicon wafer and it was on or below the level of $10^2$ pieces/cm$^3$ in the region reaching a depth of 1 μm from the interface mentioned above, representing an extreme decrease. The density of minute defects of not less than 20 nm as reduced to diameter, in the interface and in the region reaching a depth of 1 μm from the interface alike, was on the level of $10^2$ pieces/cm$^3$, representing an extreme decrease and indicating formation of a nearly perfect defectless layer. In any of the crystals, minute defects measuring not less than 20 nm were present in the region at the center of thickness of wafer (bulk region) at an approximate density of $1.0 \times 10^{10}$ pieces/cm$^3$, representing a conspicuous increase useful for the IG effect. Absolutely no crystal defect occurred in the epitaxial layer after the evaluation of heat treatment, the deflectless layer extending from the epitaxial layer through the lower surface of the substrate silicon wafer (namely the interface between the epitaxial layer and the substrate wafer) was wide, and the protrusion of minute defects such as oxygen precipitates into the epitaxial layer was absent.

Examples 38–42

Examples 38–42 concern silicon semiconductor substrates obtained by the procedure which comprised cutting a slice from a crystal containing added nitrogen, fabricating the slice into a silicon wafer and, with the silicon wafer used as a substrate wafer for the epitaxial growth of a single crystal layer, heat-treating the wafer prior to the epitaxial growth, performing a treatment for eliminating defects to a heretofore unattainable depth in the surface region of the substrate silicon wafer and simultaneously enabling the central region of the substrate wafer to retain defects at a high density, and thereafter depositing an epitaxial layer in a thickness of 5 μm. These examples describe molten silicons having nitrogen concentrations on the high level of $1.0 \times 10^9$ atoms/cm$^3$ and oxygen concentrations on the high level of $1.0 \times 10^{18}$ atoms/cm$^3$. These examples demonstrate that crystals so produced as to have nitrogen concentrations of not less than $5.0 \times 10^{13}$ atoms/cm$^3$ and not more than $1.0 \times 10^{16}$ atoms/cm$^3$ and oxygen concentrations of less than $1.0 \times 10^{17}$ atoms/cm$^3$ manifest equal effects. The production conditions and the results of evaluation are shown in Tables 19 (a) and (b) and Tables 20 (a) and (b). To be specific, Tables 19 (a) and (b) concern the data of crystals having resistivity of 10 and Tables 20 (a) and (b) concern those of crystals having resistivity of 0.02 Ωcm. The crystals were grown by pulling by the use of such a CZ single crystal growing device as illustrated in FIG. 3. The crystal cooling speeds through the range from the solidification point (Tm) −800° C. fell in the range of 2.4° C./minute to 0.8° C./minute. All the cooling speeds through the range of temperature mentioned above were not less than 2.0° C./minute. Then, through the range of crystal temperature from −400° C., the cooling speeds fell in the range of 1.2° C./minute to 0.5° C./minute. All the cooling speeds through the range of temperature mentioned above were not less than 1.0° C./minute. The heat treatments in Examples 38 and 39 were carried out in an Ar atmosphere at 1100° C. respectively for 60 minutes and 5 minutes with a view to examine the effect of the duration of heat treatment, the heat treatment in Example 40 was carried out in n oxygen atmosphere at 1100° C. for 60 minutes with a view to examining the effect of the kind of atmosphere of heat treatment, and the heat treatments in Examples 41 and 42 were carried out respectively in an Ar atmosphere at 1000° C. for 60 minutes and in an Ar atmosphere at 1300° C. for 5 minutes with a view to examining the effect of the temperature of heat treatment. As respects the distribution of densities of void defects measuring not less than 0.1 μm as reduced to diameter in the region reaching a depth of 1 μm from the interface between the epitaxial layer and the substrate silicon wafer, the densities excepting those in the crystal of Example 40 obtained by the heat treatment in an oxygen atmosphere were not more than $1.0 \times 10^2$ pieces/cm$^3$, representing a distribution of defects on a nearly zero level. Even in the wafer of Example 40 resulting from the heat treatment in the oxygen atmosphere, the density of the void defects mentioned above was on the level of, representing a conspicuous decrease as compared with the conventional level. Then, the density of minute defects measuring not less than 20 nm as reduced to diameter, in the region reaching a depth of 1 μm from the interface between the epitaxial layer and the substrate silicon wafer was not more than $1 \times 10^3$ pieces/cm$^4$, representing a conspicuous decrease in the density of defects. Meanwhile, in any of the crystals, the density of minute defects measuring not less than 20 nm in the region t the center of thickness of the substrate wafer (bulk region) was not less than $1.0 \times 10^8$ pieces/cm$^3$, representing a conspicuous increase of defects useful for the IG effect. The temperature for the heat treatment was preferred to be in the approximate range of 1100° C. to 1200° C. because the trend of minute defects toward decomposition increased in accordance as the temperature rose. The Ar atmosphere, i.e. one of the inert gases, was found to bring a greater decrease of defects than the oxygen atmosphere. The heat treatment was found to promote the decrease of the density of defects near the boundary of the epitaxial layer in proportion as the duration of the heat treatment increased. On account of the decreasing trend of the density of defects in the central region of the wafer and from the viewpoint of the cost of production, the sufficient duration of heat treatment is in the approximate range of 5 minutes to 60 minutes. Absolutely no crystal defect occurred in the epitaxial layer after the evaluation of heat treatment, the defectless layer extending from the epitaxial layer through the lower surface of the substrate silicon wafer (namely the interface between the epitaxial layer and the substrate wafer) was wide, and the protrusion of minute defects such as oxygen precipitates into the epitaxial layer was absent.

Examples 43–45

In Examples 43–45, silicon substrates were obtained by the procedure which comprised growing by pulling a crystal not containing added nitrogen, suddenly cooling the crystal during the course of growing, fabricating the crystal into a silicon wafer and, with this silicon wafer used as a substrate wafer for depositing an epitaxially grown single crystal layer, subjecting the silicon wafer to a heat treatment prior to the epitaxial growth, performing on the surface region of the substrate silicon wafer a treatment for the elimination of defects to a heretofore unattainable depth and manufacturing the substrate wafer in such a manner as to allow presence of defects at a high density in the central region thereof, and thereafter depositing an epitaxial layer in a thickness of 5 µm. These examples describe molten silicons having oxygen concentrations on a high level of $1.0 \times 10^{18}$ atoms/cm$^3$. The examples demonstrate that crystals so produced as to have oxygen concentrations of not less than $1.0 \times 10^{17}$ atoms/cm$^3$ manifested equal effects. The production conditions and the results of evaluation obtained in these examples are shown in Tables 19 (a) and (b) and Tables 20 (a) and (b). Incidentally, Tables 19 (a) and (b) concern the data of crystals having resistivity of 10 Ωm and Tables 20 (a) and (b) concern those of crystals having resistivity of 0.02 Ωm. The crystal of Example 43 was grown by pulling by the use of such a CZ single crystal as illustrated in FIG. 4. The cooling speeds of the crystal in growth were in the range of 6.0° C./minute to 2.0° C./minute through the range of solidification point (Tm)–800° C. and were not less than 2.0° C./minute throughout the range of crystal temperature from Tm to 800° C. The cooling speeds through the range of crystallization point from 800° C. to 400° C. fell in the range of 2.0° C./minute–0.5° C./minute. All the cooling speeds did not exceed 1.0° C./minute throughout the entire range of temperature mentioned above. The crystal of Example 44 was grown by pulling by the use of such a CZ single crystal growing device provided with an implement for heightening the ability to cool crystal as illustrated in FIG. 5. The crystal cooling speeds through the range of the solidification point (Tm)–800° C. fell in the range of 2.4° C./minute to 1.5° C./minute. All the cooling speeds were not less than 2.0° C./minute throughout the range of temperature mentioned above. Through the range of temperature from 800° C. to 400° C., the cooling speeds fell in the range of 1.6° C./minute to 1.2° C./minute. All the cooling speeds exceeded 1.0° C./minute throughout the entire range of crystal temperature. The crystal of Example 45 was grown by pulling by the use of such a CZ single crystal growing device provided with an implement for heightening the ability to cool a crystal as illustrated in FIG. 6. The crystal cooling speeds through the range of the solidification point (Tm)–800° C. fell in the range of 6.5° C./minute to 2.0° C./minute. Then, through the range of 800° C. to 400° C., the cooling speeds fell in the range of 2.0° C./minute to 1.2° C./minute. Throughout the entire range of crystal temperature from Tm to 800° C., all the cooling speeds were not less than 2.0° C./minute. Then, throughout the entire range of crystallization point from 800° C. to 400° C., all the cooling speeds were not less than 1.0° C. In any of the present examples, the heat treatment of the substrate silicon wafer prior to the epitaxial deposition was carried out in an Ar atmosphere at 1100° C. for 60 minutes. Though the effect of lowering the density of defects was conspicuous in the crystals which were suddenly cooled through the entire range from the solidification point to 400° C., the densities of defects below the boundary of the epitaxial layer were decreased in all the crystals. In contrast, in the region at the center of thickness of the substrate wafer, the crystals had densities of defects enough to heighten the IG effect. Incidentally, absolutely no crystal defect occurred in the epitaxial layer after the evaluation of heat treatment and the protrusion of minute defects such as oxygen precipitates into the epitaxial layer was absent.

Examples 46–48

In Examples 46 to 48, silicon semiconductor substrates were obtained by the procedure which comprised subjecting a crystal being grown by pulling simultaneously to addition of nitrogen and quenching, fabricating the crystal into a silicon wafer and, with this silicon wafer used as a substrate wafer for depositing an epitaxially grown single crystal layer, heat-treating the silicon wafer prior to the epitaxial growth, performing on the surface region of the substrate silicon wafer a treatment for the elimination of defects to a heretofore unattainable depth and manufacturing the substrate wafer in such a manner as to allow presence of defects at a high density in the central region thereof, and thereafter depositing an epitaxial layer in a thickness of 5 µm. These examples describe molten silicons having nitrogen concentrations on a high level of $1.0 \times 10^{19}$ atoms/cm$^3$ and oxygen concentrations on a high level of $1.0 \times 10^{18}$ atoms/cm$^3$. The examples demonstrate that crystals so produced as to have nitrogen concentrations of not less than $1.0 \times 10^{13}$ atoms/cm$^3$ and not more than $1.0 \times 10^{16}$ atoms/cm$^3$ and oxygen concentrations of not less than $1.0 \times 10^{17}$ atoms/cm$^3$ manifested equal effects.

The production conditions and the results of evaluation obtained in these examples are shown in Tables 19 (a) and (b) and Tables 20 (a) and (b). Incidentally, Tables 19 (a) and (b) concern the data of crystals having resistivity of 10 Ωm and Tables 20 (a) and (b) concern those of crystals having resistivity of 0.02 Ωm. The crystal of Example 46 was grown by pulling by the use of such a CZ single crystal growing device as illustrated in FIG. 4. The crystal cooling speeds were in the range of 6.0° C./minute to 2.0° C./minute through the range of solidification point (Tm)–800° C. and were not less than 2.0° C./minute throughout the range of crystal temperature from Tm to 800° C. The cooling speeds through the range of crystal temperature from 800° C. to 400° C. fell in the range of 2.0° C./minute–0.5° C./minute. All the cooling speeds did not exceed 1.0° C./minute throughout the entire range of temperature mentioned above. The crystal of Example 47 was grown by pulling by the use of such a CZ single crystal growing device provided with an implement for heightening the ability to cool crystal as illustrated in FIG. 5. The crystal cooling speeds through the range of the solidification point (Tm)–800° C. fell in the range of 2.4° C./minute to 1.5° C./minute. All the cooling speeds were not less than 2.0° C./minute throughout the range of temperature mentioned above. Through the range of temperature from 800° C. to 400° C., the cooling speeds fell in the range of 1.6° C./minute to 1.2° C./minute. All the cooling speeds exceeded 1.0° C./minute throughout the entire range of temperature. The crystal of Example 48 was grown by pulling by the use of such a CZ single crystal growing device provided with an implement for heightening the ability to cool a crystal as illustrated in FIG. 6. The crystal cooling speeds through the range of the solidification point (Tm)–800° C. fell in the range of 6.5° C./minute to 2.0° C./minute. Then, through the range of 800° C. to 400° C., the cooling speeds fell in the range of 2.0° C./minute to 1.2° C./minute. Throughout the entire range of crystal temperature from Tm to 800° C., all the cooling speeds were not less than 2.0° C./minute. Then, throughout the entire range of crystallization point from 800° C. to 400° C., all the cooling speeds exceeded 1.0° C. In any of the present examples, the heat treatment of the substrate silicon wafer prior to the epitaxial deposition was carried out in an Ar atmosphere at 1100° C. for 60 minutes. The effect of lowering the density of defects was conspicuous in the crystals which were suddenly cooled through the entire range from the solidification point to 400° C. In any of the crystals, both the densities of void defects measuring not less than 0.1 µm and the densities of minute defects measuring not less than 20 nm below the boundary of the epitaxial layer were on or below the level of $10^2$ pieces/cm$^3$, representing nearly perfect absence of defect. The densities of defects measuring not less than 20 nm in the region at the center of thickness of the substrate wafer were on a level of $10^9$ pieces/cm$^3$, representing a magnitude capable for fortifying the IG effect. Incidentally, absolutely no crystal defect occurred in the epitaxial layer after the evaluation of heat treatment and the protrusion of minute defects such as oxygen precipitates into the epitaxial layer was absent.

(Controls 4–6)

In Controls 4 to 6, crystals were grown without addition of nitrogen. To be specific, they were grown by pulling by the use of such an ordinary crystal growing device not particularly provided with an implement for suddenly cooling a crystal as illustrated in FIG. 3. The crystal cooling speeds through the range of temperature of the solidification point (Tm)–800° C. fell in the range of 2.4° C./minute to 0.8° C./minute. All the cooling speeds did not exceed 2.0° C./minute throughout the entire range of temperature mentioned above. Then, through the range of crystal temperature of 800° C.–400° C., the cooling speeds fell in the range of 1.2° C./minute to 0.5° C./minute. All the cooling speeds did not exceed 1.0° C./minute through the range of temperature mentioned above. The silicon single crystals grown herein were manufactured into silicon semiconductor substrates by fabricating them into wafers and, with the wafers used as substrate wafers, epitaxially growing a single crystal layer on the surface of a given substrate wafer in a thickness of 5 μm. The production conditions and the results of evaluation in the present controls are shown in Tables 21 (a) and (b) and Tables 22 (a) and (b). Incidentally, Tables 21 (a) and (b) concern the data of crystals having resistivity of 10 Ωcm and Tables (a) and (b) concern those of crystals having resistivity of 0.02 Ωcm. Control 4 produced crystals of a low oxygen, Control 5 those of a medium oxygen, and Control 6 those of a high oxygen. In the region reaching a depth of 1 μm from the interface between the epitaxial layer and the substrate wafer, the density of defects (void defects) measuring not less than 0.1 μm as reduced to diameter never fell below $5.0 \times 10^4$ pieces/cm$^3$ but was generally on a high level of $10^5$ pieces/cm$^3$, though the density tended to decrease in proportion as the oxygen concentration decreased. As respects minute defects measuring not less than 20 nm as reduced to diameter, the density was on a level of not less than $1.0 \times 10^6$ pieces/cm$^3$, while no density of not more than $5.0 \times 10^5$ pieces/cm$^3$ was realized. Meanwhile, in the region at the center of thickness of the substrate wafer (bulk region), the density was on a level of $1.0 \times 10^7$ pieces/cm$^3$, representing no promise of conspicuous IG effect. Incidentally, the formation of crystal defects on a level of several pieces per wafer (the protrusion of oxygen recipitates into the epitaxial layer and the formation of stacking faults) was observed after the heat treatment and the defectless layer in the neighborhood of the interface between the epitaxial layer and the substrate wafer was narrow.

(Controls 7–9)

In Controls 7 to 9, the crystals being grown by pulling were made to contain nitrogen added in such amounts that the molten silicons had nitrogen concentrations approximating $5.0 \times 10^{15}$ atoms/cm$^3$ and the crystals had nitrogen concentrations approximating $5.0 \times 10^{12}$ atoms/cm$^3$. In other words, the amounts of nitrogen added were very minute. The crystals were grown by pulling by the use of such an ordinary crystal growing device not particularly provided with an implement for suddenly cooling a crystal as illustrated in FIG. 3. The crystal cooling speeds through the range of solidification point (Tm)–800° C. fell in the range of 2.4° C./minute to 0.8° C./minute. All the cooling speeds did not exceed 2.0° C./minute throughout the entire range of temperature mentioned above. Then, through the range of crystal temperature of 800° C.–400° C., the cooling speeds fell in the range of 1.2° C./minute to 0.5° C./minute. All the cooling speeds did not exceed 1.0° C./minute through the range of temperature mentioned above. The silicon single crystals grown herein were manufactured into silicon semiconductor substrates by fabricating them into wafers and then, with the wafers used as substrate wafers, epitaxially growing a single crystal layer on the surface of a given substrate wafer in a thickness of 5 μm. The production conditions and the results of evaluation in the present controls are shown in Tables 21 (a) and (b) and Tables 22 (a) and (b). Incidentally, Tables 21 (a) (b) concern the data of crystals having resistivity of 10 Ωcm and Tables 22 (a) and (b) concern those of crystals having resistivity of 0.02 Ωcm. Control 7 produced crystals of low oxygen, Control 8 crystals of medium oxygen, and Control 9 crystals of high oxygen. In the region reaching a depth of 1 μm from the interface between the epitaxial layer and the substrate wafer, the density of defects (void defects) measuring not less than 0.1 μm as reduced to diameter and the density of minute defects measuring not less than 20 nm as reduced to diameter were nearly the same as those of Controls 4–6, representing no conspicuous effect of the addition of nitrogen. These densities, relative to their respective sizes of defects, were generally on a high level of $10^5$ pieces/cm$^3$ and on a high level of $1.0 \times 10^6$ pieces/cm$^3$. Meanwhile, as respects the region at the center of thickness of the substrate wafer (bulk region), the density of defects showed no increase and fell on a level of $1.0 \times 10^7$ pieces/cm$^3$, not promising any conspicuous IG effect. Though the crystals posed no problem about life time, the formation of crystal defects on a level of several pieces per wafer (the protrusion of oxygen precipitates into the epitaxial layer and the formation of stacking faults) was observed after the heat treatment and the defectless layer in the neighborhood of the interface between the epitaxial layer and substrate wafer was narrow.

(Control 10)

In Control 10, nitrogen was added to the crystal being grown by pulling in such an amount that the molten silicon had a nitrogen concentration approximating $4.5 \times 10^{19}$ atoms/cm$^3$ and the crystal had a nitrogen concentration approximating $3.0 \times 10^{16}$ atoms/cm$^3$. In other words, nitrogen was added in an extremely large amount. The crystal was grown by pulling by the use of such an ordinary crystal growing device not particularly provided with an implement for suddenly cooling a crystal as illustrated in FIG. 3. Though the range of the solidification point (Tm)–800° C., the crystal cooling speed fell in the range of 2.4° C./minute to 0.8° C./minute. All the cooling speeds did not exceed 2.0° C./minute throughout the entire range of temperature mentioned above. Through the range of crystal temperature of 800° C.–400° C., the cooling speed fell in the range of 1.2° C./minute to 0.5° C./minute. All the cooling speeds did not exceed 1.0° C./minute throughout the entire range of temperature mentioned above. The silicon single crystal grown herein was manufactured into a silicon semiconductor substrate by fabricating it into a wafer and then, with the wafer used as a substrate wafer, epitaxially growing a single crystal layer on the surface of the substrate wafer in a thickness of 5 μm. The production conditions and the results of evaluation in the present control are shown in Tables 21 (a) and (b) and Tables 22 (a) and (b). Incidentally, Tables 21 (a) and (b)

concern the data of a crystal having resistivity of 10 Ωcm and Tables 22 (a) and (b) concern those of a crystal having resistivity of 0.02 Ωcm. In the region reaching a depth of 1 μm from the interface between the epitaxial layer and the substrate wafer, the density of defects (void defects) measuring not less than 0.1 μm as reduced to diameter and the density of minute defects measuring not less than 20 nm as reduced to diameter were observed to decrease because the defects finely divided by the effect of nitrogen were easily decomposed during the epitaxial growth. In spite of this fact, the vacancies and impurity oxygen, i.e. the component elements of the decomposed defects, were observed to diffuse in the epitaxial layer and form new defects in the epitaxial layer.

TABLE 9

Silicon substrate resistivity: 10 Ωcm

| | Production conditions | | | | | | |
|---|---|---|---|---|---|---|---|
| | Nitrogen in fusion/ cm³ | Pulling speed mm/min | Nitrogen in crystal/ cm³ | Oxygen in crystal/ cm³ | Tm – 800° C. >2.0° C./min | 800 – 400° C. >1.0° C./min | Heat treatment |
| Example 5 | 1.0E17 | 0.8 | 1.0E14 | 3.0E17 | — | — | — |
| Example 6 | 2.0E17 | 0.8 | 2.0E14 | 8.0E17 | — | — | — |
| Example 7 | 5.0E17 | 0.8 | 5.0E14 | 9.5E17 | — | — | — |
| Example 8 | 8.0E18 | 0.8 | 7.0E15 | 3.0E17 | — | — | — |
| Example 9 | 1.0E19 | 0.8 | 1.0E16 | 8.0E17 | — | — | — |
| Example 10 | 9.0E18 | 0.8 | 8.0E15 | 9.5E17 | — | — | — |

| | Defects within depth of 1 μm from boundary of epitaxial layer | | Bulk defects | Defects in epitaxial layer |
|---|---|---|---|---|
| | Size > 0.1 μm/cm³ | Size > 20 nm/cm³ | Size > 20 nm/cm³ | Pieces/wafer |
| Example 5 | 9.0E2 | 1.5E5 | 1.0E9 | None detected |
| Example 6 | 9.0E2 | 6.5E5 | 5.0E9 | None detected |
| Example 7 | 8.5E2 | 6.0E5 | 6.0E9 | None detected |
| Example 8 | 6.0E2 | 1.0E5 | 1.5E9 | None detected |
| Example 9 | 6.0E2 | 5.0E5 | 6.0E9 | None detected |
| Example 10 | 9.0E2 | 5.5E5 | 8.0E9 | None detected |

○ : Inside range
—: Outside range

TABLE 10

Silicon substrate resistivity: 0.02 Ωcm

| | Production conditions | | | | | | |
|---|---|---|---|---|---|---|---|
| | Nitrogen in fusion/ cm³ | Pulling speed mm/min | Nitrogen in crystal/ cm³ | Oxygen in crystal/ cm³ | Tm – 800° C. >2.0° C./min | 800 – 400° C. >1.0° C./min | Heat treatment |
| Example 5 | 5.0E16 | 0.9 | 5.0E13 | 3.0E17 | — | — | — |
| Example 6 | 1.0E17 | 0.9 | 1.0E14 | 8.0E17 | — | — | — |
| Example 7 | 2.0E16 | 0.9 | 2.0E13 | 9.5E17 | — | — | — |
| Example 8 | 1.0E19 | 0.9 | 1.0E16 | 3.0E17 | — | — | — |
| Example 9 | 1.0E19 | 0.9 | 1.0E16 | 8.0E17 | — | — | — |
| Example 10 | 1.0E19 | 0.9 | 1.0E16 | 9.5E17 | — | — | — |

| | Defects within depth of 1 μm from boundary of epitaxial layer | | Bulk defects | Defects in epitaxial layer |
|---|---|---|---|---|
| | Size > 0.1 μm/cm³ | Size > 20 nm/cm³ | Size > 20 nm/cm³ | Pieces/wafer |
| Example 5 | 8.0E2 | 1.0E5 | 3.0E9 | None detected |
| Example 6 | 8.0E2 | 5.0E5 | 6.0E9 | None detected |
| Example 7 | 7.5E2 | 5.0E5 | 6.5E9 | None detected |
| Example 8 | 5.0E2 | 1.0E5 | 5.0E9 | None detected |
| Example 9 | 5.0E2 | 4.0E5 | 8.0E9 | None detected |
| Example 10 | 8.0E2 | 5.0E5 | 9.5E9 | None detected |

○ : Inside range
—: Outside range

TABLE 11

Silicon substrate resistivity: 10 Ωcm

| | Production conditions | | | | | | |
|---|---|---|---|---|---|---|---|
| | Nitrogen in fusion/ cm$^3$ | Pulling speed mm/min | Nitrogen in crystal/ cm$^3$ | Oxygen in crystal/ cm$^3$ | Tm – 800° C. >2.0° C./min | 800 – 400° C. >1.0° C./min | Heat treatment |
| Example 11 | — | 1.2 | — | 2.0E17 | ○ | — | — |
| Example 12 | — | 1.0 | — | 8.0E17 | ○ | — | — |
| Example 13 | — | 1.1 | — | 10.0E17 | ○ | — | — |

| | Defects within depth of 1 μm from boundary of epitaxial layer | | Bulk defects | Defects in epitaxial layer |
|---|---|---|---|---|
| | Size > 0.1 μm/cm$^3$ | Size > 20 nm/cm$^3$ | Size > 20 nm/cm$^3$ | Pieces/wafer |
| Example 11 | 3.0E3 | 1.0E4 | 1.0E8 | None detected |
| Example 12 | 5.0E3 | 2.0E4 | 5.0E8 | None detected |
| Example 13 | 6.0E3 | 4.0E4 | 5.5E8 | None detected |

○ : Inside range
—: Outside range

TABLE 12

Silicon substrate resistivity: 0.02 Ωcm

| | Production conditions | | | | | | |
|---|---|---|---|---|---|---|---|
| | Nitrogen in fusion/ cm$^3$ | Pulling speed mm/min | Nitrogen in crystal/ cm$^3$ | Oxygen in crystal/ cm$^3$ | Tm – 800° C. >2.0° C./min | 800 – 400° C. >1.0° C./min | Heat treatment |
| Example 11 | — | 1.0 | — | 2.0E17 | ○ | — | — |
| Example 12 | — | 1.0 | — | 8.0E17 | ○ | — | — |
| Example 13 | — | 1.1 | — | 10.0E17 | ○ | — | — |

| | Defects within depth of 1 μm from boundary of epitaxial layer | | Bulk defects | Defects in epitaxial layer |
|---|---|---|---|---|
| | Size > 0.1 μm/cm$^3$ | Size > 20 nm/cm$^3$ | Size > 20 nm/cm$^3$ | Pieces/wafer |
| Example 11 | 2.0E3 | 1.0E4 | 2.0E8 | None detected |
| Example 12 | 4.0E3 | 1.0E4 | 6.0E8 | None detected |
| Example 13 | 5.0E3 | 4.0E4 | 8.0E8 | None detected |

○ : Inside range
—: Outside range

TABLE 13

Silicon substrate resistivity: 10 Ωcm

| | Production conditions | | | | | | |
|---|---|---|---|---|---|---|---|
| | Nitrogen in fusion/ cm$^3$ | Pulling speed mm/min | Nitrogen in crystal/ cm$^3$ | Oxygen in crystal/ cm$^3$ | Tm – 800° C. >2.0° C./min | 800 – 400° C. >1.0° C./min | Heat treatment |
| Example 14 | — | 1.0 | — | 3.0E17 | — | ○ | — |
| Example 15 | — | 0.9 | — | 8.0E17 | — | ○ | — |
| Example 16 | — | 0.8 | — | 10.0E17 | — | ○ | — |

| | Defects within depth of 1 μm from boundary of epitaxial layer | | Bulk defects | Defects in epitaxial layer |
|---|---|---|---|---|
| | Size > 0.1 μm/cm$^3$ | Size > 20 nm/cm$^3$ | Size > 20 nm/cm$^3$ | Pieces/wafer |
| Example 14 | 7.0E3 | 5.0E4 | 6.0E6 | None detected |
| Example 15 | 7.5E3 | 9.0E4 | 2.0E7 | None detected |
| Example 16 | 9.0E3 | 1.0E5 | 4.5E7 | None detected |

○ : Inside range
—: Outside range

TABLE 14

Silicon substrate resistivity: 0.02 Ωcm

| | Production conditions | | | | | | |
|---|---|---|---|---|---|---|---|
| | Nitrogen in fusion/ cm$^3$ | Pulling speed mm/min | Nitrogen in crystal/ cm$^3$ | Oxygen in crystal/ cm$^3$ | Tm – 800° C. >2.0° C./min | 800 – 400° C. >1.0° C./min | Heat treatment |
| Example 14 | — | 0.9 | — | 3.0E17 | — | ○ | — |
| Example 15 | — | 0.8 | — | 8.0E17 | — | ○ | — |
| Example 16 | — | 0.8 | — | 10.0E17 | — | ○ | — |

| | Defects within depth of 1 μm from boundary of epitaxial layer | | Bulk defects | Defects in epitaxial layer |
|---|---|---|---|---|
| | Size > 0.1 μm/cm$^3$ | Size > 20 nm/cm$^3$ | Size > 20 nm/cm$^3$ | Pieces/wafer |
| Example 14 | 6.0E3 | 4.0E4 | 7.0E7 | None detected |
| Example 15 | 6.5E3 | 7.0E4 | 4.0E7 | None detected |
| Example 16 | 8.0E3 | 9.0E4 | 8.0E7 | None detected |

○ : Inside range
—: Outside range

TABLE 15

Silicon substrate resistivity: 10 Ωcm

| | Production conditions | | | | | | |
|---|---|---|---|---|---|---|---|
| | Nitrogen in fusion/ cm$^3$ | Pulling speed mm/min | Nitrogen in crystal/ cm$^3$ | Oxygen in crystal/ cm$^3$ | Tm – 800° C. >2.0° C./min | 800 – 400° C. >1.0° C./min | Heat treatment |
| Example 17 | — | 1.2 | — | 3.0E17 | ○ | ○ | — |
| Example 18 | — | 1.1 | — | 8.0E17 | ○ | ○ | — |
| Example 19 | — | 1.1 | — | 10.0E17 | ○ | ○ | — |

| | Defects within depth of 1 μm from boundary of epitaxial layer | | Bulk defects | Defects in epitaxial layer |
|---|---|---|---|---|
| | Size > 0.1 μm/cm$^3$ | Size > 20 nm/cm$^3$ | Size > 20 nm/cm$^3$ | Pieces/wafer |
| Example 17 | 1.2E3 | 8.0E3 | 2.0E8 | None detected |
| Example 18 | 3.0E3 | 1.0E4 | 6.0E8 | None detected |
| Example 19 | 4.5E3 | 2.0E4 | 5.5E8 | None detected |

○ : Inside range
—: Outside range

TABLE 16

Silicon substrate resistivity: 0.02 Ωcm

| | Production conditions | | | | | | |
|---|---|---|---|---|---|---|---|
| | Nitrogen in fusion/ cm$^3$ | Pulling speed mm/min | Nitrogen in crystal/ cm$^3$ | Oxygen in crystal/ cm$^3$ | Tm – 800° C. >2.0° C./min | 800 – 400° C. >1.0° C./min | Heat treatment |
| Example 17 | — | 1.2 | — | 3.0E17 | ○ | ○ | — |
| Example 18 | — | 1.1 | — | 8.0E17 | ○ | ○ | — |
| Example 19 | — | 1.1 | — | 10.0E17 | ○ | ○ | — |

| | Defects within depth of 1 μm from boundary of epitaxial layer | | Bulk defects | Defects in epitaxial layer |
|---|---|---|---|---|
| | Size > 0.1 μm/cm$^3$ | Size > 20 nm/cm$^3$ | Size > 20 nm/cm$^3$ | Pieces/wafer |
| Example 17 | 1.0E3 | 5.0E3 | 4.0E8 | None detected |
| Example 18 | 1.5E3 | 1.0E4 | 8.0E8 | None detected |
| Example 19 | 3.0E3 | 1.5E4 | 9.5E8 | None detected |

○ : Inside range
—: Outside range

TABLE 17

Silicon substrate resistivity: 10 Ωcm

Production conditions

| | Nitrogen in fusion/ cm$^3$ | Pulling speed mm/min | Nitrogen in crystal/ cm$^3$ | Oxygen in crystal/ cm$^3$ | Tm − 800° C. >2.0° C./min | 800 − 400° C. >1.0° C./min | Heat treatment |
|---|---|---|---|---|---|---|---|
| Example 20 | 2.0E16 | 0.8 | 1.5E13 | 4.0E17 | ○ | — | — |
| Example 21 | 2.0E16 | 0.8 | 1.5E13 | 8.0E17 | ○ | — | — |
| Example 22 | 5.0E16 | 0.8 | 4.0E13 | 10.0E17 | ○ | — | — |
| Example 23 | 2.0E18 | 1.0 | 1.0E15 | 4.0E17 | ○ | — | — |
| Example 24 | 2.0E18 | 1.0 | 1.0E15 | 8.0E17 | ○ | — | — |
| Example 25 | 2.0E18 | 1.0 | 1.0E15 | 10.0E17 | ○ | — | — |
| Example 26 | 2.0E16 | 1.0 | 1.5E13 | 3.0E17 | — | ○ | — |
| Example 27 | 2.0E16 | 0.8 | 1.5E13 | 8.0E17 | — | ○ | — |
| Example 28 | 5.0E16 | 0.8 | 4.0E13 | 9.0E17 | — | ○ | — |
| Example 29 | 4.5E18 | 1.1 | 3.0E15 | 3.0E17 | — | ○ | — |
| Example 30 | 4.5E18 | 1.0 | 3.0E15 | 8.0E17 | — | ○ | — |
| Example 31 | 4.5E18 | 0.9 | 3.0E15 | 9.0E17 | — | ○ | — |
| Example 32 | 5.0E16 | 1.2 | 4.0E13 | 4.0E17 | ○ | ○ | — |
| Example 33 | 5.0E16 | 1.1 | 4.0E13 | 7.5E17 | ○ | ○ | — |
| Example 34 | 2.0E16 | 1.1 | 1.5E13 | 9.5E17 | ○ | ○ | — |
| Example 35 | 2.0E18 | 1.1 | 1.0E15 | 4.0E17 | ○ | ○ | — |
| Example 36 | 2.0E18 | 1.1 | 1.0E15 | 7.5E17 | ○ | ○ | — |
| Example 37 | 2.0E18 | 1.1 | 1.0E15 | 9.5E17 | ○ | ○ | — |

| | Defects within depth of 1 μm from boundary of epitaxial layer | | Bulk defects | Defects in epitaxial layer |
|---|---|---|---|---|
| | Size > 0.1 μm/cm$^3$ | Size > 20 nm/cm$^3$ | Size > 20 nm/cm$^3$ | Pieces/wafer |
| Example 20 | 4.0E2 | 1.2E3 | 8.0E9 | None detected |
| Example 21 | 4.5E2 | 2.0E3 | 1.0E10 | None detected |
| Example 22 | 6.0E2 | 2.0E3 | 1.5E10 | None detected |
| Example 23 | 1.2E2 | 1.2E3 | 1.0E10 | None detected |
| Example 24 | 1.5E2 | 1.2E3 | 2.0E10 | None detected |
| Example 25 | 2.0E2 | 1.2E3 | 2.5E10 | None detected |
| Example 26 | 6.0E2 | 1.8E3 | 8.5E8 | None detected |
| Example 27 | 8.5E2 | 6.0E3 | 1.0E9 | None detected |
| Example 28 | 9.5E2 | 6.0E3 | 2.0E9 | None detected |
| Example 29 | 4.0E2 | 1.2E3 | 1.5E9 | None detected |
| Example 30 | 6.0E2 | 1.5E3 | 3.0E9 | None detected |
| Example 31 | 7.0E2 | 1.5E3 | 5.0E9 | None detected |
| Example 32 | <1.0E2 | 6.0E2 | 1.0E10 | None detected |
| Example 33 | 2.4E2 | 9.0E2 | 1.2E10 | None detected |
| Example 34 | 3.0E2 | 9.0E2 | 2.1E10 | None detected |
| Example 35 | <1.0E2 | 6.0E2 | 1.5E10 | None detected |
| Example 36 | <1.0E2 | 3.0E2 | 2.3E10 | None detected |
| Example 37 | 1.2E2 | 3.0E2 | 2.5E10 | None detected |

○ : Inside range
— : Outside range

TABLE 18

Silicon substrate resistivity: 0.02 Ωcm

Production conditions

| | Nitrogen in fusion/ cm$^3$ | Pulling speed mm/min | Nitrogen in crystal/ cm$^3$ | Oxygen in crystal/ cm$^3$ | Tm − 800° C. >2.0° C./min | 800 − 400° C. >1.0° C./min | Heat treatment |
|---|---|---|---|---|---|---|---|
| Example 20 | 2.0E16 | 0.9 | 1.5E13 | 4.0E17 | ○ | — | — |
| Example 21 | 2.0E16 | 1.0 | 1.5E13 | 8.0E17 | ○ | — | — |
| Example 22 | 5.0E16 | 1.0 | 4.0E13 | 10.0E17 | ○ | — | — |
| Example 23 | 2.0E18 | 0.9 | 1.0E15 | 4.0E17 | ○ | — | — |
| Example 24 | 2.0E18 | 1.0 | 1.0E15 | 8.0E17 | ○ | — | — |
| Example 25 | 2.0E18 | 1.0 | 1.0E15 | 10.0E17 | ○ | — | — |
| Example 26 | 2.0E16 | 0.8 | 1.5E13 | 3.0E17 | — | ○ | — |
| Example 27 | 2.0E16 | 0.8 | 1.5E13 | 8.0E17 | — | ○ | — |
| Example 28 | 5.0E16 | 0.8 | 4.0E13 | 9.0E17 | — | ○ | — |
| Example 29 | 4.5E18 | 0.8 | 3.0E15 | 3.0E17 | — | ○ | — |
| Example 30 | 4.5E18 | 0.8 | 3.0E15 | 8.0E17 | — | ○ | — |
| Example 31 | 4.5E18 | 0.9 | 3.0E15 | 9.0E17 | — | ○ | — |
| Example 32 | 5.0E16 | 1.1 | 4.0E13 | 4.0E17 | ○ | ○ | — |
| Example 33 | 5.0E16 | 1.2 | 4.0E13 | 7.5E17 | ○ | ○ | — |
| Example 34 | 2.0E16 | 1.2 | 1.5E13 | 9.5E17 | ○ | ○ | — |

TABLE 18-continued

| | | | | | | | |
|---|---|---|---|---|---|---|---|
| Example 35 | 2.0E18 | 1.2 | 1.0E15 | 4.0E17 | ○ | ○ | — |
| Example 36 | 2.0E18 | 1.2 | 1.0E15 | 7.5E17 | ○ | ○ | — |
| Example 37 | 2.0E18 | 1.2 | 1.0E15 | 9.5E17 | ○ | ○ | — |

| | Defects within depth of 1 μm from boundary of epitaxial layer | | Bulk defects | Defects in epitaxial layer |
|---|---|---|---|---|
| | Size > 0.1 μm/cm³ | Size > 20 nm/cm³ | Size > 20 nm/cm³ | Pieces/wafer |
| Example 20 | 3.0E2 | 1.0E3 | 1.0E10 | None detected |
| Example 21 | 3.0E2 | 1.5E3 | 1.5E10 | None detected |
| Example 22 | 4.0E2 | 1.5E3 | 1.5E10 | None detected |
| Example 23 | 1.0E2 | 1.0E3 | 1.0E10 | None detected |
| Example 24 | 1.0E2 | 1.0E3 | 1.5E10 | None detected |
| Example 25 | 1.0E2 | 1.0E3 | 2.0E10 | None detected |
| Example 26 | 4.0E2 | 1.0E3 | 1.0E9 | None detected |
| Example 27 | 6.0E2 | 4.0E3 | 1.0E9 | None detected |
| Example 28 | 6.0E2 | 5.0E3 | 2.0E9 | None detected |
| Example 29 | 3.0E2 | 1.0E3 | 3.0E9 | None detected |
| Example 30 | 4.0E2 | 1.0E3 | 1.5E9 | None detected |
| Example 31 | 6.0E2 | 1.0E3 | 3.0E9 | None detected |
| Example 32 | <1.0E2 | 3.0E2 | 2.0E10 | None detected |
| Example 33 | <1.0E2 | 5.0E2 | 2.0E10 | None detected |
| Example 34 | <1.0E2 | 5.0E2 | 2.5E10 | None detected |
| Example 35 | <1.0E2 | 2.0E2 | 3.0E10 | None detected |
| Example 36 | <1.0E2 | 1.0E2 | 3.0E10 | None detected |
| Example 37 | 1.0E2 | 2.0E2 | 3.5E10 | None detected |

○ : Inside range
—: Outside range

TABLE 19

Silicon substrate resistivity: 10 Ωcm
Production conditions

| | Nitrogen in fusion/cm³ | Pulling speed mm/min | Nitrogen in crystal/cm³ | Oxygen in crystal/cm³ | Tm – 800° C. >2.0° C./min | 800 – 400° C. >1.0° C./min | Heat treatment |
|---|---|---|---|---|---|---|---|
| Example 38 | 1.0E19 | 0.8 | 1.0E16 | 10.0E17 | — | — | (1) |
| Example 39 | 8.0E18 | 0.8 | 5.0E15 | 10.0E17 | — | — | (2) |
| Example 40 | 8.0E18 | 0.8 | 5.0E15 | 10.0E17 | — | — | (3) |
| Example 41 | 8.0E18 | 0.8 | 5.0E15 | 10.0E17 | — | — | (4) |
| Example 42 | 8.0E18 | 0.8 | 5.0E15 | 10.0E17 | — | — | (5) |
| Example 43 | — | 0.8 | — | 10.0E17 | ○ | — | (1) |
| Example 44 | — | 0.8 | — | 10.0E17 | — | ○ | (1) |
| Example 45 | — | 0.8 | — | 10.0E17 | ○ | ○ | (1) |
| Example 46 | 8.0E18 | 1.0 | 5.0E15 | 10.0E17 | ○ | — | (1) |
| Example 47 | 4.5E18 | 0.9 | 3.0E15 | 9.0E17 | — | ○ | (1) |
| Example 48 | 8.0E18 | 1.1 | 5.0E15 | 10.0E17 | ○ | ○ | (1) |

○ : Inside range
—: Outside range
Conditions of heat treatment (1) Ar, 1100° C., 60 minutes
(2) Ar, 1100° C., 5 minutes
(3) O₂, 1100° C., 60 minutes
(4) Ar, 1000° C., 60 minutes
(5) Ar, 1300° C., 5 minutes

| | Defects within depth of 1 μm from boundary of epitaxial layer | | Bulk defects | Defects in epitaxial layer |
|---|---|---|---|---|
| | Size > 0.1 μm/cm³ | Size > 20 nm/cm³ | Size > 20 nm/cm³ | Pieces/wafer |
| Example 38 | <1.0E2 | 9.0E2 | 1.0E9 | None detected |
| Example 39 | <1.0E2 | 1.0E4 | 1.0E9 | None detected |
| Example 40 | 1.2E3 | 3.0E3 | 1.0E9 | None detected |
| Example 41 | <1.0E2 | 1.0E4 | 1.0E9 | None detected |
| Example 42 | <1.0E2 | <1.0E2 | 1.0E8 | None detected |
| Example 43 | 4.5E2 | 1.2E3 | 5.0E8 | None detected |
| Example 44 | 9.5E2 | 1.2E3 | 1.0E8 | None detected |
| Example 45 | 3.0E2 | 1.2E3 | 6.0E8 | None detected |

TABLE 19-continued

| | | | | |
|---|---|---|---|---|
| Example 46 | <1.0E2 | 3.0E2 | 2.0E9 | None detected |
| Example 47 | <1.0E2 | 6.0E2 | 1.0E9 | None detected |
| Example 48 | <1.0E2 | <1.0E2 | 3.0E9 | None detected |

TABLE 20

Silicon substrate resistivity: 0.02 Ωcm

| | Production conditions | | | | | | |
|---|---|---|---|---|---|---|---|
| | Nitrogen in fusion/cm$^3$ | Pulling speed mm/min | Nitrogen in crystal/cm$^3$ | Oxygen in crystal/cm$^3$ | Tm − 800° C. >2.0° C./min | 800 − 400° C. >1.0° C./min | Heat treatment |
| Example 38 | 1.0E19 | 0.9 | 1.0E16 | 10.0E17 | — | — | (1) |
| Example 39 | 8.0E18 | 0.9 | 5.0E15 | 10.0E17 | — | — | (2) |
| Example 40 | 8.0E18 | 0.9 | 5.0E15 | 10.0E17 | — | — | (3) |
| Example 41 | 8.0E18 | 0.9 | 5.0E15 | 10.0E17 | — | — | (4) |
| Example 42 | 8.0E18 | 0.9 | 5.0E15 | 10.0E17 | — | — | (5) |
| Example 43 | — | 0.8 | — | 10.0E17 | ○ | — | (1) |
| Example 44 | — | 0.8 | — | 10.0E17 | — | ○ | (1) |
| Example 45 | — | 0.8 | — | 10.0E17 | ○ | ○ | (1) |
| Example 46 | 8.0E18 | 1.0 | 5.0E15 | 10.0E17 | ○ | — | (1) |
| Example 47 | 4.5E18 | 0.9 | 3.0E15 | 9.0E17 | — | ○ | (1) |
| Example 48 | 8.0E18 | 1.1 | 5.0E15 | 10.0E17 | ○ | ○ | (1) |

○ : Inside range
—: Outside range
Conditions of heat treatment (1) Ar, 1100° C., 60 minutes
(2) Ar, 1100° C., 5 minutes
(3) O$_2$, 1100° C., 60 minutes
(4) Ar, 1000° C., 60 minutes
(5) Ar, 1300° C., 5 minutes

| | Defects within depth of 1 μm from boundary of epitaxial layer | | Bulk defects | Defects in epitaxial layer |
|---|---|---|---|---|
| | Size > 0.1 μm/cm$^3$ | Size > 20 nm/cm$^3$ | Size > 20 nm/cm$^3$ | Pieces/wafer |
| Example 38 | <1.0E2 | 5.0E2 | 1.0E9 | None detected |
| Example 39 | <1.0E2 | 5.0E3 | 1.0E9 | None detected |
| Example 40 | <1.0E2 | 1.0E3 | 1.0E9 | None detected |
| Example 41 | <1.0E2 | 5.0E3 | 1.0E9 | None detected |
| Example 42 | <1.0E2 | <1.0E2 | 1.0E8 | None detected |
| Example 43 | 4.5E2 | 5.0E2 | 5.0E8 | None detected |
| Example 44 | 9.5E2 | 5.0E2 | 1.0E8 | None detected |
| Example 45 | 3.0E2 | 6.0E2 | 6.0E8 | None detected |
| Example 46 | <1.0E2 | <1.0E2 | 2.0E9 | None detected |
| Example 47 | <1.0E2 | 2.0E2 | 1.0E9 | None detected |
| Example 48 | <1.0E2 | <1.0E2 | 3.0E9 | None detected |

TABLE 21

Silicon substrate resistivity: 10 Ωcm

| | Production conditions | | | | | | |
|---|---|---|---|---|---|---|---|
| | Nitrogen in fusion/cm$^3$ | Pulling speed mm/min | Nitrogen in crystal/cm$^3$ | Oxygen in crystal/cm$^3$ | Tm − 800° C. >2.0° C./min | 800 − 400° C. >1.0° C./min | Heat treatment |
| Control 4 | — | 0.8 | — | 2.0E17 | — | — | — |
| Control 5 | — | 0.8 | — | 8.0E17 | — | — | — |
| Control 6 | — | 0.8 | — | 10.0E17 | — | — | — |
| Control 7 | 8.0E15 | 0.8 | 5.0E12 | 2.0E17 | — | — | — |
| Control 8 | 8.0E15 | 0.8 | 5.0E12 | 8.0E17 | — | — | — |
| Control 9 | 8.0E15 | 0.8 | 5.0E12 | 10.0E17 | — | — | — |
| Control 10 | 4.5E19 | 0.8 | 3.0E16 | 10.0E17 | — | — | — |

TABLE 21-continued

| | Defects within depth of 1 μm from boundary of epitaxial layer | | Bulk defects | Defects in epitaxial layer |
|---|---|---|---|---|
| | Size > 0.1 μm/cm³ | Size > 20 nm/cm³ | Size > 20 nm/cm³ | Pieces/wafer |
| Control 4 | 9.0E4 | 1.0E6 | 5.0E6 | 3 |
| Control 5 | 1.0E5 | 3.0E6 | 2.0E7 | 6 |
| Control 6 | 5.0E5 | 5.0E6 | 3.0E7 | 8 |
| Control 7 | 6.0E4 | 8.0E5 | 1.0E7 | 2 |
| Control 8 | 1.0E5 | 2.0E6 | 3.0E7 | 4 |
| Control 9 | 3.0E5 | 5.0E6 | 5.0E7 | 3 |
| Control 10 | 1.0E3 | 2.0E5 | 5.0E9 | 75 |

○ : Inside range
—: Outside range

TABLE 22

Silicon substrate resistivity: 0.02 Ωcm

| | Production conditions | | | | | | |
|---|---|---|---|---|---|---|---|
| | Nitrogen in fusion/ cm³ | Pulling speed mm/min | Nitrogen in crystal/ cm³ | Oxygen in crystal/ cm³ | Tm – 800° C. >2.0° C./min | 800 – 400° C. >1.0° C./min | Heat treatment |
| Control 4 | — | 0.8 | — | 2.0E17 | — | — | — |
| Control 5 | — | 0.9 | — | 8.0E17 | — | — | — |
| Control 6 | — | 0.9 | — | 10.0E17 | — | — | — |
| Control 7 | 8.0E15 | 0.8 | 5.0E12 | 2.0E17 | — | — | — |
| Control 8 | 8.0E15 | 0.9 | 5.0E12 | 8.0E17 | — | — | — |
| Control 9 | 8.0E15 | 0.9 | 5.0E12 | 10.0E17 | — | — | — |
| Control 10 | 4.5E19 | 0.9 | 3.0E16 | 10.0E17 | — | — | — |

| | Defects within depth of 1 μm from boundary of epitaxial layer | | Bulk defects | Defects in epitaxial layer |
|---|---|---|---|---|
| | Size > 0.1 μm/cm³ | Size > 20 nm/cm³ | Size > 20 nm/cm³ | Pieces/wafer |
| Control 4 | 1.0E5 | 3.5E6 | 5.0E6 | 3 |
| Control 5 | 2.0E5 | 2.0E6 | 2.0E7 | 6 |
| Control 6 | 4.0E5 | 6.0E6 | 3.0E7 | 8 |
| Control 7 | 9.0E4 | 1.0E6 | 1.0E7 | 2 |
| Control 8 | 1.5E5 | 2.0E6 | 3.0E7 | 4 |
| Control 9 | 2.5E5 | 5.0E6 | 5.0E7 | 3 |
| Control 10 | 1.5E3 | 1.0E5 | 1.0E10 | 55 |

○ : Inside range
—: Outside range

Industrial Utilizability

The silicon semiconductor substrate of this invention according to the first aspect has very few crystal defects in the region thereof allocated for forming devices as described above. Since the semiconductor devices to be formed on the substrate enjoy improved yield and exalted reliability, therefore, this silicon semiconductor substrate has an effect of contributing to the improvement of productivity and the reduction of cost in the process for manufacturing such semiconductor devices.

The method of this invention for the production of a silicon semiconductor substrate according to the first aspect allows effective abolition of void defects in the silicon semiconductor substrate and, at the same time, permits oxygen precipitates to be easily disappeared by a simple heat treatment on account of the smallness of size. Consequently, it has now become possible to manufacture with high productivity a silicon semiconductor substrate which has a single crystal surface layer of high quality necessary for the formation of semiconductor devices.

The silicon semiconductor substrate of this invention according to the second aspect very rarely suffers occurrence of defects in the epitaxial layer and in the neighborhood of the interface between the epitaxial layer and the substrate wafer and, even after going through the process of heat treatment for the manufacture of devices, avoids formation of crystal defects in the epitaxial layer. Since this silicon semiconductor substrate has precipitates contained copiously in the wafer, it constitutes itself an epitaxial wafer which excels in the gettering ability to be manifested for the heat treatment in the manufacture of devices. The method of this invention for the production according to the second aspect is capable of manufacturing the silicon semiconductor substrate mentioned above more simply and easily at a lower cost than ever.

What is claimed is:

1. A silicon semiconductor substrate obtained from a silicon single crystal grown by the Czochralski method, characterized by the fact that the density of crystal defects measuring not less than 0.1 μm as reduced to diameter is not more than $10^4$ pieces/cm³ at least in the region reaching a depth of 1 μm from the surface of the substrate.

2. A silicon semiconductor substrate according to claim 1, wherein the nitrogen content at the center of thickness of the silicon semiconductor substrate is not less than $1 \times 10^{13}$ atoms/cm and not more than $1 \times 10^{16}$ atoms/cm³.

3. A silicon semiconductor substrate according to claim 1, wherein the nitrogen content of the silicon semiconductor substrate is not more than $1\times10^{16}$ atoms/cm$^3$ and the nitrogen concentration determined by subjecting the interior of the substrate to the test by the secondary ion mass analysis method has a part locally concentrated by nitrogen segregation exhibiting a signal intensity not less than twice the average signal intensity.

4. A silicon semiconductor substrate according to claim 1, wherein the nitrogen content at the center of thickness of the silicon semiconductor substrate is not less than $1\times10^{13}$ atoms/cm$^3$ and not more than $1\times10^{16}$ atoms/cm$^3$ and the nitrogen concentration determined by subjecting the interior of the substrate to the test by the secondary ion mass analysis method has a part locally concentrated by nitrogen segregation exhibiting a signal intensity not less than twice the average signal intensity.

5. A silicon semiconductor substrate obtained from a silicon single crystal grown by the Czochralski method, characterized by the fact that the density of crystal defects is so distributed as to decrease from the center of thickness of the substrate to the surface thereof, the surface density of crystal defects measuring not less than 0.1 μm as reduced to diameter on the surface of the substrate is not more than one piece/cm$^2$, the volumetric density of crystal defects measuring not less than 0.1 μm as reduced to diameter at a depth of 0.1 μm is not more than 1% of that at the center of thickness of the substrate, and the nitrogen content at the center of thickness of the substrate is not less than $1\times10^{13}$ atoms/cm$^3$ and not more than $1\times10^{16}$ atoms/cm$^3$.

6. A method for the production of a silicon semiconductor substrate, characterized by growing a silicon single crystal by the Czochralski method from a molten silicon containing not less than $1\times10^{16}$ atoms/cm$^3$ and not more than $1.5\times10^{19}$ atoms/cm$^3$ of nitrogen, obtaining a silicon semiconductor substrate from said silicon single crystal, and heat-treating said silicon semiconductor substrate at a temperature of not less than 1000° C. and not more than 1300° C. for not less than one hour.

7. A method for the production of a silicon semiconductor substrate according to claim 6, wherein the growth of a silicon single crystal by the Czochralski method is effected under the conditions satisfying V/G≧0.2 (mm$^2$/°C.min), providing that V (mm/min) represents the pulling speed and G (° C./mm) represents the average value of the temperature gradient in the crystal in the direction of the axis of pulling in the range of temperature from the melting point of silicon to 1300° C.

8. A method for the production of a silicon semiconductor substrate according to claim 6 or claim 7, wherein the heat treatment is carried out in an atmosphere of non-oxidizing gas.

9. A method for the production of a silicon semiconductor substrate according to claim 6 or claim 7, wherein the heat treatment is carried out in a gaseous atmosphere containing not less than 0.01 vol. % and not more than 100 vol. % of oxygen and thereafter the surface of the substrate is polished to a depth of not less than 0.5 μm and not more than 1.0 μm thereby giving a mirror finish to said surface.

10. A silicon semiconductor substrate, characterized by being produced by a procedure which comprises preparing as a substrate wafer a silicon wafer having a nitrogen content of not less than $1.0\times10^{13}$ atoms/cm$^3$ and not more than $1.0\times10^{16}$ atoms/cm$^3$ and depositing on the surface of the substrate wafer a silicon single crystal layer by the epitaxial method.

11. A silicon semiconductor substrate according to claim 10, wherein the density of crystal defects measuring not less than 20 nm as reduced to diameter at the center of thickness of the substrate wafer is not less than $1\times10^8$ pieces/cm$^3$.

12. A silicon semiconductor substrate obtained by preparing as a substrate wafer a silicon wafer having an oxygen content of not less than $1.0\times10^{17}$ atoms/cm$^3$ and depositing on the surface of the substrate wafer a silicon single crystal layer by the epitaxial method, characterized by the fact that the density of crystal defects measuring not less than 0.1 μm as reduced to diameter is not more than $5\times10^4$ pieces/cm$^3$ at least in the region reaching a depth of 1 μm from the interface between the substrate wafer and the silicon single crystal layer deposited by the epitaxial method.

13. A silicon semiconductor substrate according to claim 12, wherein said substrate wafer further contains not less than $1.0\times10^{13}$ atoms/cm$^3$ and not less than $1.0\times10^{16}$ atoms/cm$^3$ of nitrogen.

14. A silicon semiconductor substrate according to claim 12 or claim 13, wherein the density of crystal defects measuring not less than 20 nm as reduced to diameter is not less than $1\times10^8$ pieces/cm$^3$ at the center of thickness of the substrate wafer.

15. A silicon semiconductor substrate obtained by preparing as a substrate wafer a silicon wafer having an oxygen content of not less than $1.0\times10^{17}$ atoms/cm$^3$ and depositing on the surface of the substrate wafer a silicon single crystal layer by the epitaxial method, characterized by the fact that at least in the region reaching a depth of 1 μm from the interface between the substrate wafer and the silicon single crystal layer deposited by the epitaxial method, the density of crystal defects measuring not less than 20 nm as reduced to diameter is not more than $5\times10^5$ pieces/cm$^3$.

16. A silicon semiconductor substrate according to claim 15, wherein the density of crystal defects measuring not less than 0.1 μm as reduced to diameter is not more than $5\times10^4$ pieces/cm$^3$ at least in the region reaching a depth of 1 μm from the interface between the substrate wafer and the silicon single crystal layer deposited by the epitaxial method.

17. A silicon semiconductor substrate according to claim 15 or claim 16, wherein the substrate wafer further contains not less than $1.0\times10^{13}$ atoms/cm$^3$ and not more than $1.0\times10^{16}$ atoms/cm$^3$ of nitrogen.

18. A silicon semiconductor substrate according to claim 15 or claim 16, wherein the density of crystal defects measuring not less than 20 nm as reduced to diameter is not less than $1\times10^8$ pieces/cm$^3$ at the center of thickness of the substrate wafer.

19. A silicon semiconductor substrate according to claim 17, wherein the density of crystal defects measuring not less than 20 nm as reduced to diameter is not less than $1\times10^8$ pieces/cm$^3$ at the center of thickness of the substrate wafer.

20. A method for the production of a silicon semiconductor substrate, characterized by preparing as a substrate wafer a silicon wafer obtained from a silicon single crystal grown from a molten silicon containing not less than $1.0\times10^{16}$ atoms/cm$^3$ and not more than $1.0\times10^{19}$ atoms/cm$^3$ of nitrogen and depositing on the surface of the substrate wafer a silicon single crystal layer by the epitaxial method.

21. A method for the production of a silicon semiconductor substrate, characterized by preparing as a substrate wafer a silicon wafer obtained from a silicon single crystal grown by the Czochralski method at a cooling speed of not less than 2.0° C./minute through the range of crystal temperature from the solidification point to 800° C. and depositing on the surface of the substrate wafer a silicon single crystal layer by the epitaxial method.

22. A method for the production of a silicon semiconductor substrate, characterized by preparing as a substrate wafer a silicon wafer obtained from a silicon single crystal grown by the Czochralski method at a cooling speed of not less than 1.0° C./minute through the range of crystal temperature from 800° C. to 400° C. and depositing on the surface of the substrate wafer a silicon single crystal layer by the epitaxial method.

23. A method for the production of a silicon semiconductor substrate, characterized by preparing as a substrate wafer a silicon wafer grown by the Czochralski method and, during the growth by pulling, cooled through the range of crystalline temperature from the solidification point to 800° C. at a cooling speed of not less than 2.0° C./minute and subsequently through the range of crystal temperature of 800° C.–400° C. at a cooling speed of not less than 1.0° C./minute and depositing on the surface of the substrate wafer a silicon single crystal layer by the epitaxial method.

24. A method for the production of a silicon semiconductor substrate according to any of claims 21–23, wherein the silicon single crystal is grown from a molten silicon containing not less than $1.0 \times 10^{16}$ atoms/cm$^3$ and not more than $1.5 \times 10^{19}$ atoms/cm$^3$ of nitrogen.

25. A method for the production of a silicon semiconductor substrate according to any of claims 21–23, wherein a silicon wafer is obtained as a substrate wafer from a silicon single crystal grown by the Czochralski method and heat-treated at a temperature of not less than 1000° C. and not more than 1300° C. for not less than 5 minutes and a silicon single crystal layer is deposited on the surface of the substrate wafer by the epitaxial method.

26. A method for the production of a silicon semiconductor substrate according to claim 24, wherein a silicon wafer is obtained as a substrate wafer from a silicon single crystal grown by the Czochralski method and heat-treated at a temperature of not less than 1000° C. and not more than 1300° C. for not less than 1 minutes and a silicon single crystal layer is deposited on the surface of the substrate wafer by the epitaxial method.

* * * * *